United States Patent
Park et al.

(10) Patent No.: US 12,324,321 B2
(45) Date of Patent: Jun. 3, 2025

(54) LIGHT EMITTING DISPLAY PANEL AND LIGHT EMITTING DISPLAY APPARATUS USING THE SAME

(71) Applicant: LG Display Co., Ltd., Seoul (KR)

(72) Inventors: Eunji Park, Paju-si (KR); KyungMin Kim, Paju-si (KR); Ji-Heun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 503 days.

(21) Appl. No.: 17/555,274

(22) Filed: Dec. 17, 2021

(65) Prior Publication Data

US 2022/0208925 A1 Jun. 30, 2022

(30) Foreign Application Priority Data

Dec. 30, 2020 (KR) .................. 10-2020-0188160

(51) Int. Cl.
*H10K 59/126* (2023.01)
*G09G 3/3291* (2016.01)
(Continued)

(52) U.S. Cl.
CPC ......... *H10K 59/126* (2023.02); *G09G 3/3291* (2013.01); *H10K 59/1213* (2023.02); *H10K 59/122* (2023.02); *H10K 59/131* (2023.02)

(58) Field of Classification Search
CPC ............. H10K 59/126; H10K 59/1213; H10K 59/122; H10K 59/131; H10K 59/12;
(Continued)

(56) References Cited

U.S. PATENT DOCUMENTS 7,300,831 B2 11/2007 Oh et al.
8,298,844 B2 10/2012 Lee et al.
(Continued)

FOREIGN PATENT DOCUMENTS

KR 10-2005-0003258 A 1/2005
KR 10-2005-0098122 A 10/2005
(Continued)

OTHER PUBLICATIONS

Office Action dated Apr. 23, 2025 issued in corresponding Korean Patent Application No. 10-2020-0188160.

*Primary Examiner* — Wasiul Haider
(74) *Attorney, Agent, or Firm* — Morgan, Lewis & Bockius LLP

(57) ABSTRACT

A light emitting display panel includes a substrate including a non-display area and a display area with pixels, a driving light-shielding electrode on the substrate, a buffer covering the driving light-shielding electrode, a pixel driving circuit layer in the buffer, including a driving transistor connected with the driving light-shielding electrode, a planarization layer covering the pixel driving circuit layer, an anode in the planarization layer and connected with the driving light-shielding electrode and the driving transistor, a repair line in the planarization layer, a bank covering an outer portion of the anode to form an opening area from which the anode is exposed, a light emitting layer on the anode and the bank, and a cathode on the light emitting layer, wherein the repair line is connected with an island-shaped contact electrode below the repair line, and at least one insulating layer is below the contact electrode.

16 Claims, 16 Drawing Sheets

(51) Int. Cl.
*H10K 59/121* (2023.01)
*H10K 59/122* (2023.01)
*H10K 59/131* (2023.01)

(58) Field of Classification Search
CPC .............. H10K 59/124; H10K 71/861; G09G 2300/0842; G09G 2330/08; G09G 2330/10; G09G 3/006; G09G 3/3233; G09G 3/3291; G09G 3/3225; H01L 27/124; H01L 27/1248; H01L 27/1222
See application file for complete search history.

(56) References Cited

U.S. PATENT DOCUMENTS

| | | | |
|---|---|---|---|
| 2015/0084014 A1* | 3/2015 | Kim | H10K 59/88 438/4 |
| 2015/0270323 A1 | 9/2015 | Cho et al. | |
| 2017/0062542 A1* | 3/2017 | Jung | H10K 50/805 |
| 2018/0151658 A1* | 5/2018 | Jeong | H10K 59/126 |
| 2020/0013992 A1* | 1/2020 | Cheng | H10K 50/81 |
| 2020/0212131 A1 | 7/2020 | Kim et al. | |
| 2021/0183983 A1* | 6/2021 | Bang | H10K 59/122 |
| 2021/0358961 A1* | 11/2021 | Wu | G02F 1/136259 |

FOREIGN PATENT DOCUMENTS

| | | |
|---|---|---|
| KR | 10-2011-0083093 A | 7/2011 |
| KR | 10-2015-0111005 A | 10/2015 |
| KR | 10-2016-0006110 A | 1/2016 |
| KR | 10-2016-0043803 A | 4/2016 |
| KR | 10-2016-0065667 A | 6/2016 |
| KR | 10-2017-0026900 A | 3/2017 |
| KR | 10-2018-0025718 A | 3/2018 |
| KR | 10-2018-0047607 A | 5/2018 |
| KR | 10-2020-0079740 A | 7/2020 |
| KR | 10-2020-0080896 A | 7/2020 |

* cited by examiner

LIGHT EMITTING DISPLAY PANEL AND LIGHT EMITTING DISPLAY APPARATUS USING THE SAME

CROSS-REFERENCE TO RELATED APPLICATIONS

This application claims the benefit of the Korean Patent Application No. 10-2020-0188160 filed on Dec. 30, 2020, which are hereby incorporated by reference as if fully set forth herein.

BACKGROUND

Technical Field

The present disclosure relates to a light emitting display panel and a light emitting display apparatus using the same.

Discussion of the Related Art

A light emitting display apparatus is a display apparatus for outputting light by using a light emitting element, and includes a light emitting display panel provided with light emitting elements.

In a process of manufacturing a light emitting display panel, a characteristic deterioration or an internal short of a thin film transistor may occur, whereby a pixel may not be driven normally. In order to drive a light emitting element provided in a defective pixel that is not normally driven, a repair line may be provided in the light emitting display panel. The repair line serves to connect a driving transistor provided in a normal pixel with the light emitting element provided in the defective pixel.

However, in the light emitting display panel of the related art in which contact holes are formed by etching of a planarization layer, a pixel driving circuit layer and a buffer, a driving light-shielding electrode provided below the buffer is exposed through a repair contact hole even in a state that a repair process is not performed. Therefore, the repair process through the repair line cannot be performed normally.

SUMMARY

Accordingly, embodiments of the present disclosure are directed to a light emitting display panel and a light emitting display apparatus using the same that substantially obviate one or more of the problems due to limitations and disadvantages of the related art.

An aspect of the present disclosure is to provide a light emitting display panel and a light emitting display apparatus in which an island type contact electrode is provided below a repair line provided between normal pixels.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display panel comprises a substrate including a non-display area and a display area provided with pixels, a driving light-shielding electrode provided on the substrate in the form of a pattern, a buffer covering the driving light-shielding electrode, a pixel driving circuit layer provided in the buffer, including a driving transistor connected with the driving light-shielding electrode, a planarization layer covering the pixel driving circuit layer, an anode provided in the planarization layer and connected with the driving light-shielding electrode and the driving transistor, a repair line provided in the planarization layer, a bank covering an outer portion of the anode to form an opening area from which the anode is exposed, a light emitting layer provided on the anode and the bank, and a cathode provided on the light emitting layer, wherein the repair line is connected with an island-shaped contact electrode provided below the repair line, and at least one insulating layer is provided below the contact electrode.

In another aspect, a light emitting display apparatus comprises the above light emitting display panel, a data driver for supplying data voltages to data lines provided in the light emitting display panel, a gate driver for supplying gate voltages to gate lines provided in the light emitting display panel, and a controller for controlling the data driver and the gate driver.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
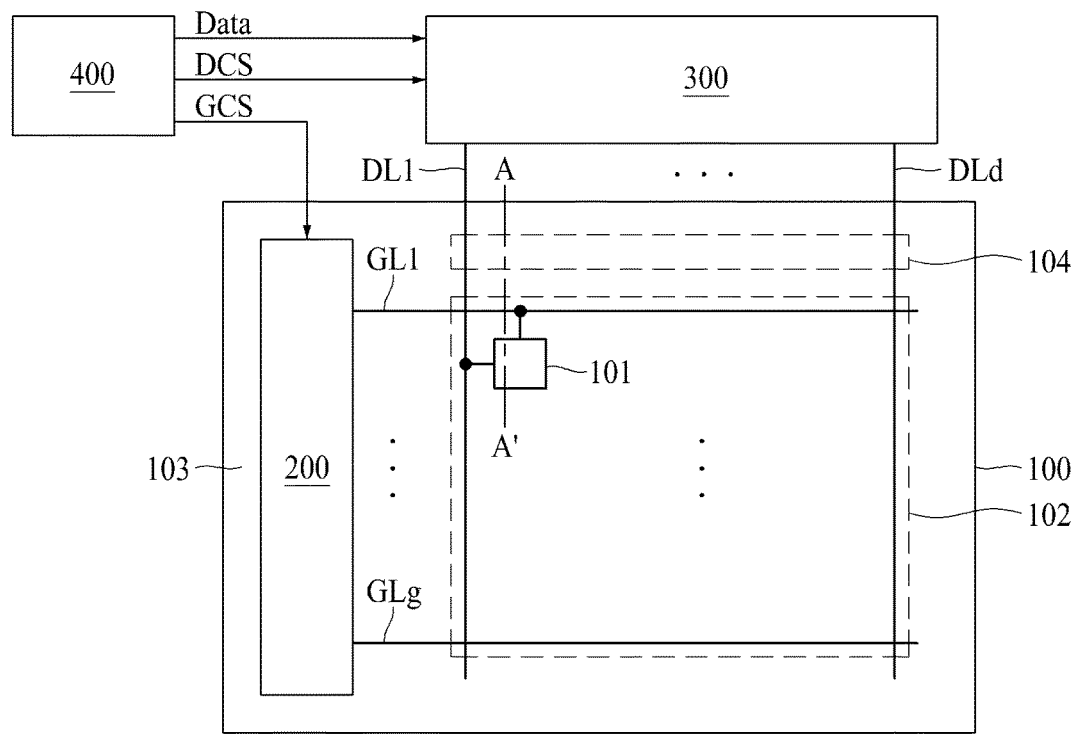
FIG. 1 is an exemplary view illustrating a structure of a light emitting display apparatus according to the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

In the drawings, the same or similar elements are denoted by the same reference numerals even though they are depicted in different drawings. Wherever possible, the same reference numbers will be used throughout the drawings to refer to the same or like parts.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It should be understood that the term "at least one" includes all combinations related with any one item. For example, "at least one among a first element, a second element and a third element" may include all combinations of two or more elements selected from the first, second and third elements as well as each element of the first, second and third elements.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the embodiment of the present disclosure will be described in detail with reference to the accompanying drawings.

Figure 2:
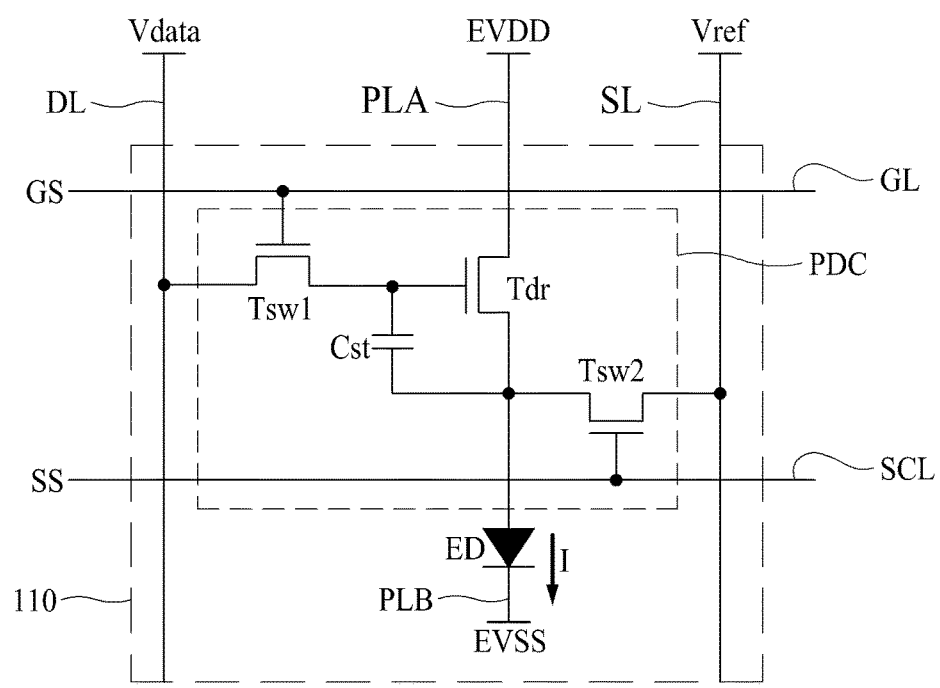
FIG. 2 is an exemplary view illustrating a structure of a pixel applied to a light emitting display apparatus according to the present disclosure.

FIG. 1 is an exemplary view illustrating a structure of a light emitting display apparatus according to the present disclosure, and FIG. 2 is an exemplary view illustrating a structure of a pixel applied to a light emitting display apparatus according to the present disclosure.

The light emitting display apparatus according to the present disclosure may constitute various electronic devices. The electronic device may be, for example, a smart phone, a tablet PC, a television, a monitor or the like.

As shown in FIG. 1, the light emitting display apparatus according to the present disclosure includes a light emitting display panel 100 including a display area 102, on which an image is output, and a non-display area 103 provided outside the display area, a gate driver 200 for supplying a gate signal to gate lines GL1 to GLg provided in the display area of the light emitting display panel, a data driver 300 for supplying data voltages to data lines DL1 to DU provided in the light emitting display panel, and a controller 400 for controlling driving of the gate driver 200 and the data driver 300, wherein 'g' and 'd' are natural numbers.

First of all, the light emitting display panel 100 includes a display area 102 and a non-display area 103. The display area 102 is provided with gate lines GL1 to GLg, data lines DL1 to DLd, and pixels 101.

As shown in FIG. 2, the pixel 101 provided in the light emitting display panel 100 may include a light emitting element ED, a switching transistor Tsw1, a storage capacitor Cst, a driving transistor Tdr and a sensing transistor Tsw2. That is, the pixel 101 may include a pixel driving circuit PDC and a light emitting unit, wherein the pixel driving circuit PDC may include a switching transistor Tsw1, a storage capacitor Cst, a driving transistor Tdr and a sensing transistor Tsw2, and the light emitting unit may include a light emitting element ED.

Brightness of light may be controlled in accordance with a magnitude of a current I flowing in the light emitting element ED, the magnitude of the current I flowing in the light emitting element ED may be controlled by the driving transistor Tdr, and the driving transistor Tdr may be controlled by the data voltage Vdata.

The light emitting element ED may include any one of an organic light emitting layer, an inorganic light emitting layer and a quantum dot light emitting layer, or may include a deposited or mixed structure of an organic light emitting layer (or inorganic light emitting layer) and a quantum dot light emitting layer.

Also, the light emitting element ED may emit light corresponding to any one of various colors such as red, green and blue colors, or may emit white light.

The switching transistor Tsw1 constituting the pixel driving circuit PDC is turned on or off by a gate signal GS supplied to the gate line GL, and the data voltage Vdata supplied through the data line DL is supplied to the driving transistor Tdr when the switching transistor Tsw1 is turned on. A first voltage EVDD is supplied to the driving transistor Tdr and the light emitting element ED through a first voltage supply line PLA, and a second voltage EVSS is supplied to the light emitting element ED through a second voltage supply line PLB. The sensing transistor Tsw2 is turned on or off by a sensing control signal SS supplied through a sensing control line SCL, and a sensing line SL may be connected to the sensing transistor Tsw2. A reference voltage Vref may be supplied to the pixel 101 through the sensing line SL, and a sensing signal related to a characteristic change of the driving transistor Tdr may be transmitted to the sensing line SL through the sensing transistor Tsw2.

The pixel 101 applied to the present disclosure may be formed in the structure shown in FIG. 2, but the present disclosure is not limited thereto. Therefore, the pixel applied to the present disclosure may be changed in various forms in addition to the structure shown in FIG. 2.

In the light emitting display panel 100, pixel areas provided with pixels 101 are formed, and signal lines for supplying various signals to the pixel driving circuit PDC provided in the pixel 101 are formed.

For example, in the light emitting display panel that includes the pixel 101 shown in FIG. 2, signal lines may include a gate line GL, a data line DL, a sensing control line SCL, a first voltage supply line PLA, a second voltage supply line PLB and a sensing line SL.

Next, the data driver 300 may be provided in a chip-on film attached to the light emitting display panel 100, and may also be connected to a main substrate provided with the controller 400. In this case, lines for electrically connecting the controller 400, the data driver 300 and the light emitting display panel 100 may be provided in the chip-on-film. To this end, the lines are electrically connected to pads provided in the main substrate and the light emitting display panel 100. The main substrate is electrically connected with an external substrate on which an external system is mounted.

The data driver 300 may be directly mounted on the light emitting display panel 100 and then electrically connected with the main substrate.

However, the data driver 300 may be formed as one integrated circuit together with the controller 400. The integrated circuit may be provided in the chip-on film or directly mounted on the light emitting display panel 100.

The data driver 300 may receive a sensing signal related to the characteristic change of the driving transistor Tdr provided in the light emitting display panel from the light emitting display panel 100 and transmit the sensing signal to the controller 400.

Then, the gate driver 200 may be provided as an integrated circuit and then mounted on the non-display area 103, or may directly be embedded in the non-display area 103 using a gate-in-panel (GIP) scheme. When the gate-in-panel scheme is used, the transistors constituting the gate driver 200 may be provided in the non-display area 103 through the same process as that of the transistors provided in the respective pixels 101 of the display area 102.

When a gate pulse generated by the gate driver 200 is supplied to a gate of the switching transistor Tsw1 provided in the pixel 101, the switching transistor is turned on, whereby light may be output from the pixel. When a gate-off signal is supplied to the switching transistor Tsw1, the switching transistor Tsw1 is turned off, whereby light is not output from the pixel. The gate signal GS supplied to the gate line GL includes a gate pulse and a gate-off signal.

Next, the controller 400 may include a data aligner for realigning input image data transmitted from an external system using a timing synchronization signal transmitted from the external system and supplying the realigned image data Data to the data driver 300, a control signal generator for generating a gate control signal GCS and a data control signal DCS using the timing synchronization signal, an input unit for receiving the timing synchronization signal and the input image data transmitted from the external system and transmitting them to the data aligner and the control signal generator, and an output unit for outputting the image data Data generated from the data aligner and the control signals DCS and GCS generated from the control signal generator to the data driver 300 or the gate driver 200.

The controller 400 may serve to sense a touch and a touch position by analyzing touch sensing signals received through a touch panel embedded in the light emitting display panel 100 or attached to the light emitting display panel 100.

Finally, the external system serves to drive the controller 400 and the electronic device. For example, when the electronic device is a smart phone, the external system may receive various kinds of voice information, image information and text information through a wireless communication network and transmit the received image information to the controller 400. The image information may be input image data.

Hereinafter, a light emitting display panel having the pixel structure shown in FIG. 2 among various types of light emitting display panels will be described as an example of a light emitting display panel according to the present disclosure.

FIGS. 3A to 3E are cross-sectional views illustrating a method of manufacturing a light emitting display panel according to the present disclosure. Particularly, FIGS. 3A to 3E illustrate cross-sections taken along line A-A' shown in FIG. 1. That is, FIGS. 3A to 3E are exemplary views illustrating cross-sections of a pad portion 104 provided in a non-display area 103 and a pixel 101 provided in a display area 102.

The light emitting display panel 100 according to the present disclosure includes a substrate 110 including a non-display area 103 and a display area 102 provided with pixels 101, a driving light-shielding electrode 120 provided in the substrate in the form of a pattern, a buffer 130 covering the driving light-shielding electrode 120, a pixel driving circuit layer 140 provided in the buffer 130, including a driving transistor Tdr connected with the driving light-shielding electrode 120, a planarization layer 160 covering the pixel driving circuit layer 140, an anode 171 provided in the planarization layer 160 and connected with the driving light-shielding electrode 120 and the driving transistor Tdr, a repair line provided in the planarization layer, a bank 180 forming an opening area OA from which the anode 171 is exposed, by covering an outer portion of the anode 171, a light emitting layer 172 provided on the anode 171 and the bank 180, and a cathode 173 provided on the light emitting layer.

First, the substrate 110 may be a glass substrate or a plastic substrate, and may be formed of various types of films.

The driving light-shielding electrode 120 may be formed of at least one of various types of metals. The driving light-shielding electrode 120 is provided to overlap the driving transistor Tdr. The driving light-shielding electrode 120 may be connected to a first electrode 141 of the driving transistor Tdr. The driving light-shielding electrode 120 and the first electrode 141 may be connected with the anode 171 through an anode line 174.

Each of the pixels 101 provided in the display area 102 includes a driving light-shielding electrode 120. Therefore, the driving light-shielding electrode 120 may be provided in the substrate 110 in the form of a pattern.

The driving light-shielding electrode 120 may be made of at least one of various metals such as copper (Cu) and molybdenum-titanium alloy (MoTi).

A pad portion 104 of the non-display area 103 may be provided with a pad light-shielding electrode 121 together with the driving light-shielding electrode 120.

The pad light-shielding electrode 121 may be connected to any one of a gate line GL, a data line DL, a sensing line SL, a sensing control line SCL and other various lines provided in the light emitting display panel 100.

Next, the buffer 130 is provided on an entire surface of the display area 102 to cover the driving light-shielding electrode 120. The buffer 130 may be formed of at least one inorganic layer or at least one organic layer, or may be formed of at least one inorganic layer and at least one organic layer.

Next, the pixel driving circuit layer 140 including the driving transistor Tdr is provided on an upper end of the buffer 130.

The pixel driving circuit layer 140 is provided with a pixel driving circuit PDC that includes a driving transistor Tdr. As described with reference to FIG. 2, the pixel driving circuit PDC may include a switching transistor Tsw1, a storage capacitor Cst, a driving transistor Tdr and a sensing transistor Tsw2. Therefore, in addition to the driving transistor Tdr, the pixel driving circuit layer 140 may include a switching transistor Tsw1, a storage capacitor Cst, a driving transistor Tdr and a sensing transistor Tsw2.

The pixel driving circuit layer 140 may be provided with a data line DL connected with the pixel driving circuit PDC, a gate line GL, a sensing control line SCL, a sensing line SL and a first voltage supply line PLA.

Therefore, the pixel driving circuit layer 140 may include at least two metal layers and at least two insulating layers for insulating the at least two metal layers.

Figure 3A:
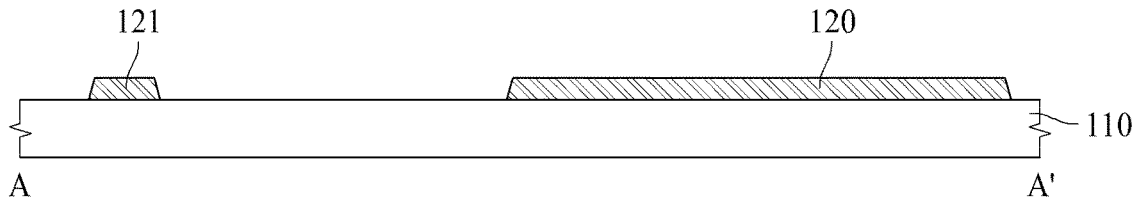
FIGS. 3A to 3E are cross-sectional views illustrating a method of manufacturing a light emitting display panel according to the present disclosure.
Figure 3B:
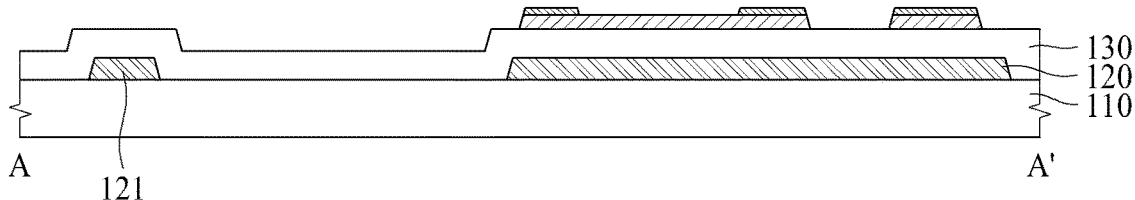
Figure 3C:
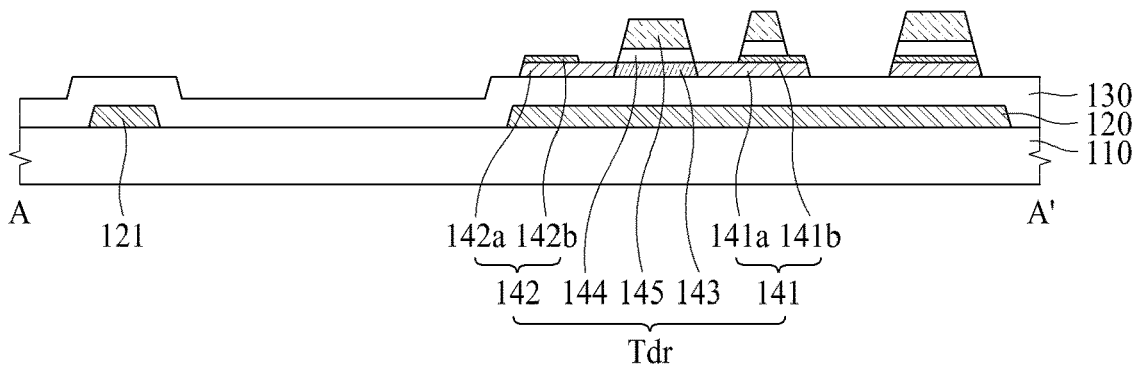
Figure 3D:
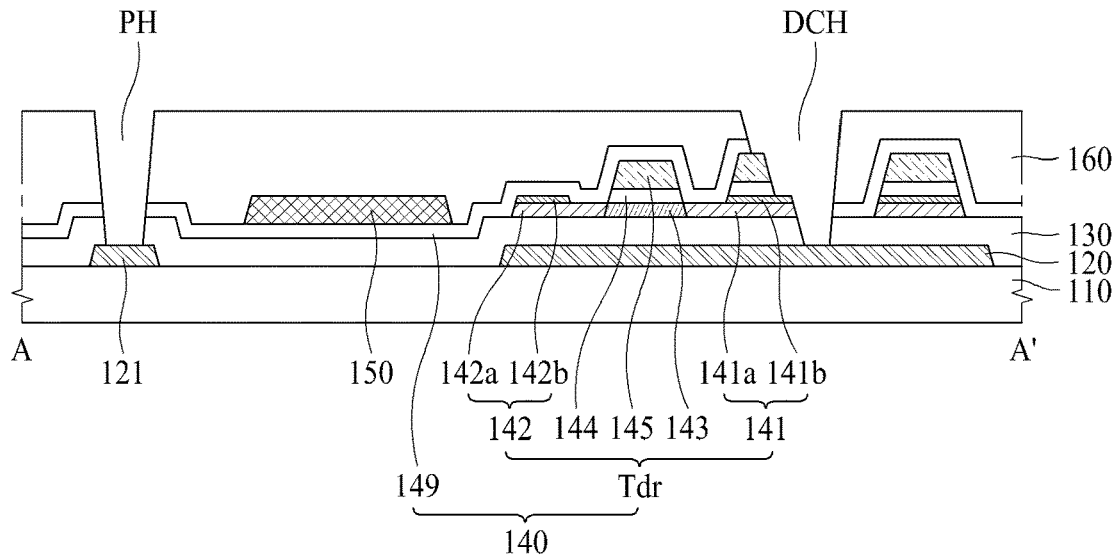
Figure 3E:
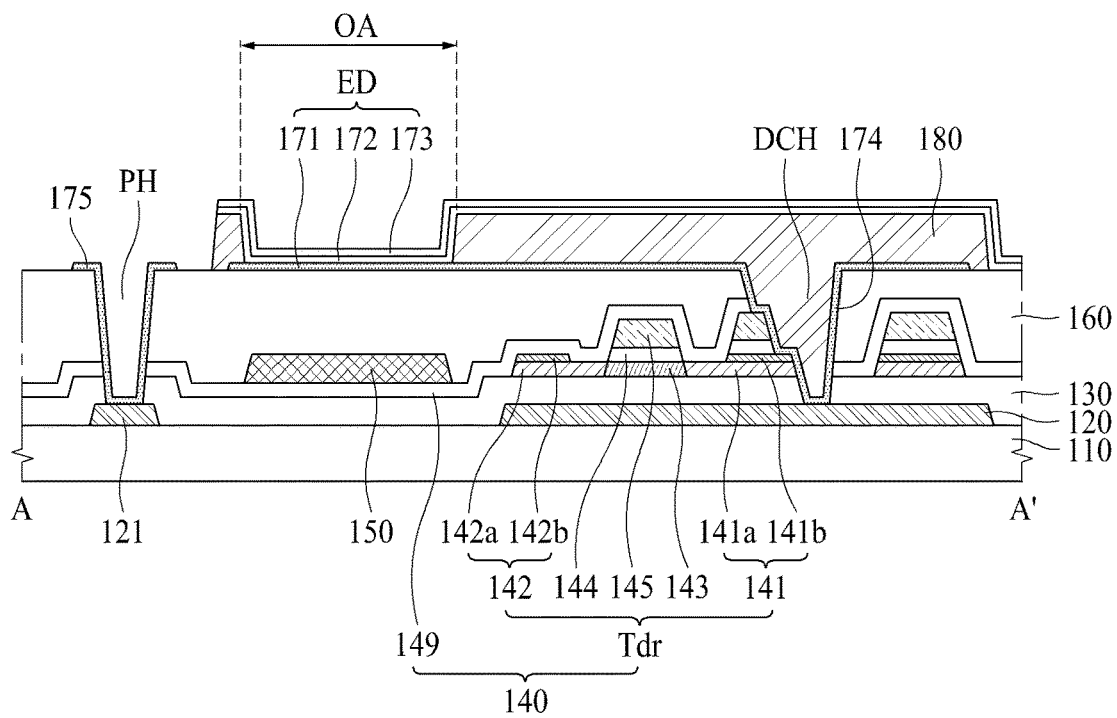

For example, when the driving transistor Tdr, as shown in FIG. 3E, includes a semiconductor layer 143 provided on an upper end of the buffer 130, a first electrode 141 provided on one side of the semiconductor layer and connected with the anode 171, a second electrode 142 provided on the other side of the semiconductor layer 143, a gate insulating layer 144 provided on an upper end of the semiconductor layer 143, and a gate 145 provided on an upper end of the gate insulating layer, the pixel driving circuit layer 140 may include a first metal layer forming the first electrode 141 and the semiconductor layer 143 and a second metal layer forming the gate 145, and may also include a first insulating layer forming the gate insulating layer 144 and a second insulating layer forming a passivation layer 149 covering the driving transistor Tdr on the upper end of the gate 145.

Each of the insulating layers may be formed of at least one inorganic layer or at least one organic layer, and may be formed of at least one inorganic layer and at least one organic layer.

Each of the metal layers may be comprised of at least one of various metals such as copper (Cu) and molybdenum-titanium alloy (MoTi), and may include a conductorized semiconductor.

The first electrode 141 constituting the driving transistor Tdr may include a first active layer 141a provided on the upper end of the buffer 130 and provided on one side of the semiconductor layer 143, and a first conductor layer 141b provided on an upper end of the first active layer 141a, and the second electrode 142 may include a second active layer 142a provided on the upper end of the buffer 130 and provided on the other side of the semiconductor layer 143, and a second conductor layer 142b provided on an upper end of the second active layer 142a.

In this case, the first active layer 141a constituting the first electrode 141 and the second active layer 142a constituting the second electrode 142 may be a conductorized semiconductor. That is, the first active layer 141a and the second active layer 142a may be formed by additionally performing an ion implantation process or an ultraviolet irradiation process on a layer formed of the same material as that of the semiconductor layer 143.

Next, the planarization layer 160 is provided on the pixel driving circuit layer 140.

For example, the pixel driving circuit layer 140 may include various types of transistors and signal lines, which form the pixel driving circuit PDC. In this case, various types of transistors and the signal lines may be different from each other in height, and a height of an area which the transistors and the signal lines are provided may be different from that of an area in which the transistors and the signal lines are not provided.

By this height difference, an upper surface formed by transistors and the signal lines is not flat. Therefore, the upper surface of the pixel driving circuit layer 140 is not flat.

The planarization layer 160 serves to planarize the upper surface of the pixel driving circuit layer 140 that is not flat. That is, the planarization layer 160 is formed to have a height higher than that of the pixel driving circuit layer 140, whereby an upper surface of the planarization layer 160 may form a flat surface.

The planarization layer 160 may be formed of at least one organic layer, and may be formed of at least one inorganic layer and at least one organic layer.

A color filter 150 may be provided in an area corresponding to the anode 171 on an upper end of the passivation layer 149 constituting the pixel driving circuit layer 140. However, in addition to the upper end of the passivation layer 149, the color filter 150 may be provided at various positions. For example, the color filter 150 may be provided on an upper end of an encapsulation layer that covers the cathode 173.

When the color filter 150 is provided on the upper end of the passivation layer 149, the color filter 150 may be covered by the planarization layer 160.

Next, the anode 171 is provided on an upper end of the planarization layer 160. The anode 171 forms the light emitting element ED.

The anode 171 is electrically connected with the driving transistor Tdr provided in the pixel driving circuit layer 140, and is patterned for each pixel.

The anode 171 may be one of the two electrodes constituting the light emitting element ED. For example, when the light emitting element ED is an organic light emitting diode, the organic light emitting diode may include a first pixel electrode, a light emitting layer 172 provided on an upper end of the first pixel electrode, and a second pixel electrode provided on an upper end of the light emitting layer 172. The first pixel electrode may be the anode 171, and the second pixel electrode may be the cathode 173. In this case, the anode 171 is connected with the first electrode 141 of the driving transistor Tdr through the anode line 174.

That is, the anode 171 provided on the planarization layer 160 may electrically be connected with a transistor provided in the pixel driving circuit layer 140, particularly the driving transistor Tdr.

The anode 171 may be formed of a transparent electrode such as indium tin oxide (ITO) or indium zinc oxide (IZO), may be formed of an opaque electrode such as copper (Cu), or may be formed of a transparent electrode and an opaque electrode.

The anode 171 may include at least one opaque electrode when the light emitting display panel according to the present disclosure uses a top emission method, that is, a method of outputting light in an upper direction of the anode 171.

The anode 171 may include at least one transparent electrode when the light emitting display panel according to the present disclosure uses a bottom emission method, that is, a method of outputting light in a bottom direction of the anode 171.

In addition to the anode 171, the anode line 174 for connecting the anode 171 to the first electrode 141 of the driving transistor Tdr may be provided on the upper end of the planarization layer 160. The anode line 174 may be provided in a driving contact hole DCH that passes through the planarization layer 160, the pixel driving circuit layer 140 and the buffer 130.

A repair line may be provided on the upper end of the planarization layer 160. The repair line will be described below with reference to FIGS. 4 to 13E.

A pad electrode 175 may be formed on the pad portion 104 on the upper end of the planarization layer 160. The pad electrode 175 may be connected with the pad light-shielding electrode 121 through a pad hole PH that passes through the planarization layer 160, the pixel driving circuit layer 140 and the buffer 130.

The pad formed of the pad light-shielding electrode 121 and the pad electrode 175 may be connected with any one of the gate line GL, the data line DL, the sensing line SL, the sensing control line SCL and other various lines provided in the light emitting display panel 100.

Next, the bank 180 covers outer edges of the anode 171 to form an opening area OA in which light is output from one pixel 101.

As shown in FIG. 3E, the bank 180 is formed to surround an outer portion of the anode 171.

That is, the bank 180 covers ends of the anode 171, and may be provided on the entire surface of the substrate 110 to expose the anode 171. However, the bank 180 may be formed of various patterns that form the opening area OA.

The bank 180 may prevent light from being overlapped between adjacent pixels.

The bank 180 may be formed of at least one inorganic layer or at least one organic layer, and may be formed of at least one inorganic layer and at least one organic layer.

Next, the light emitting layer 172 may be provided on the entire surface of the substrate 110 to cover the anode 171 and the bank 180.

The light emitting layer 172 may include any one of an organic light emitting layer, an inorganic light emitting layer and a quantum dot light emitting layer, or may include a deposited or mixed structure of an organic light emitting layer (or inorganic light emitting layer) and a quantum dot light emitting layer.

The light emitting layer 172 may include a hole injection layer HIL, a hole transport layer HTL, a hole blocking layer HBL, an electron injection layer EIL, an electron transport layer ETL, an electron blocking layer EBL and a charge generation layer CGL.

When the light emitting layer 172 outputs white light, the light emitting layer 172 may include a hole injection layer HIL/hole transport layer HTL, a blue organic layer, an electron injection layer EIL/charge generation layer CGL/electron transport layer ETL, a red organic layer, a yellow green organic layer, an electron injection layer EIL/charge generation layer CGL/electron transport layer ETL, a blue organic layer, an electron injection layer EIL/electron transport layer ETL and an organic buffer, which are sequentially deposited on the anode 171.

In addition to the layers having the deposited order described as above, the light emitting layer 172 may be comprised of layers having various deposited orders.

The light emitting layer 172 may be configured to output light having various colors such as red, green and blue, and may be configured to output white light.

When the light emitting layer 172 outputs white light, a color filter may be provided below the light emitting layer 172 or on an upper end of the light emitting layer 172.

For example, the color filter may be provided on an upper end of the cathode 173, or may be provided on a lower end of the planarization layer 160 as shown in FIG. 3E.

Next, the cathode 173 may be provided on the upper end of the light emitting layer 172, particularly may be provided on the entire surface of the substrate 110 in the form of a plate. However, the cathode 173 may be formed in various shapes having an opening.

The cathode 173 may be a second pixel electrode of the organic light emitting diode.

When the light emitting display panel 100 according to the present disclosure uses a top emission method, the cathode 173 may be formed of a transparent electrode, for example, indium tin oxide (ITO) or indium zinc oxide (IZO).

When the light emitting display panel 100 according to the present disclosure uses a bottom emission method, the cathode 173 may be made of at least one of various metals such as copper (Cu) and molybdenum-titanium alloy (MoTi).

Finally, the cathode 173 is covered by the encapsulation layer.

When the light emitting layer 172 outputs white light, the cathode 173 may be covered by the encapsulation layer, a color filter may be provided on a portion corresponding to the anode 171 of the upper end of the encapsulation layer, and a black matrix may be provided on a portion corresponding to the bank 180 on the upper end of the encapsulation layer. Another passivation layer may further be provided on the upper end of the black matrix and the color filter. Each pixel may output one of red light, green light, white light and blue light by the color filter. However, as described above, the color filter may be provided at various positions on the lower end of the planarization layer 160.

When the light emitting layer 172 outputs light having a unique color, the color filter may be omitted.

The encapsulation layer may be formed of at least one inorganic layer or at least one organic layer, and may be formed of at least one inorganic layer and at least one organic layer.

Another passivation layer may also serve as the encapsulation layer, and may be formed of at least one inorganic layer or at least one organic layer, or may be formed of at least one inorganic layer and at least one organic layer.

Hereinafter, an example of a method of manufacturing a light emitting display panel according to the present disclosure will briefly be described with reference to FIGS. 3A to 3E.

First, as shown in FIG. 3A, the driving light-shielding electrode 120 and the pad light-shielding electrode 121 are formed on the substrate 110 by exposure and etching processes using a first mask.

Next, as shown in FIG. 3B, the driving light-shielding electrode 120 and the pad light-shielding electrode 121 are covered by the buffer 130. On the upper end of the buffer 130, first metal materials forming the semiconductor layer 143, the first electrode 141 and the second electrode 142, which constitute the driving transistor Tdr, are formed by exposure and etching processes using a second mask.

As shown in FIG. 3C, the gate insulating layer 144 and the gate 145 are formed by exposure and etching processes using a third mask, whereby the semiconductor layer 143, the first electrode 141 and the second electrode 142 may be formed.

Next, as shown in FIG. 3D, the driving transistor Tdr is covered by the passivation layer 149, and the color filter 150 is provided in areas corresponding to the opening OA of the passivation layer 149 by using fourth to sixth masks.

The color filter 150 and the passivation layer 149 are covered by the planarization layer 160, and the planarization layer 160, the pixel driving circuit layer 140 (particularly, passivation layer 149) and the buffer 130 are etched by exposure and etching processes using a seventh mask to form a pad hole PH and a driving contact hole DCH. In this case, a repair contact hole, which will be described below, is also formed.

Finally, as shown in FIG. 3E, a metal material for forming the anode 171, the anode line 174 and the pad electrode 175 is provided on the upper end of the planarization layer 160, a bank material for forming the bank 180 is provided on an upper end of the metal material, and the metal material and the bank material are etched by exposure and etching processes using an eighth mask to form the bank 180, the anode 171, the anode line 174 and the pad electrode 175. In this case, the repair line may be formed on the upper end of the planarization layer 160, and in particular, the repair line is formed in a repair contact hole provided in the planarization layer 160.

Afterwards, the light emitting layer 172 and the cathode 173 are provided to cover the anode 171 and the bank 180, and the cathode 173 may be covered by the encapsulation layer.

As described above, the light emitting display panel 100 according to the present disclosure may be formed using eight masks, and particularly, the planarization layer 160, the pixel driving circuit layer 140 and the buffer 130 may be etched to form various types of contact holes (pad hole PH, driving contact hole DCH and repair contact hole).

Figure 4:
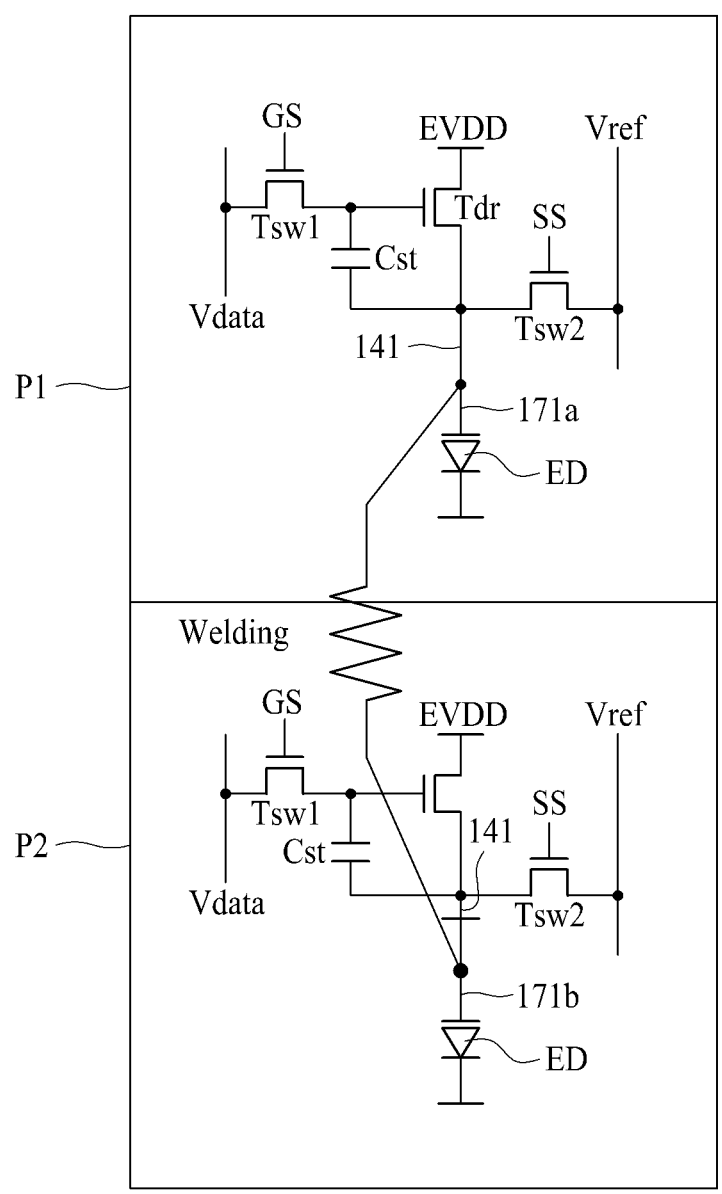
FIG. 4 is an exemplary view illustrating two pixels that are repaired in a light emitting display panel according to the present disclosure.
Figure 5A:
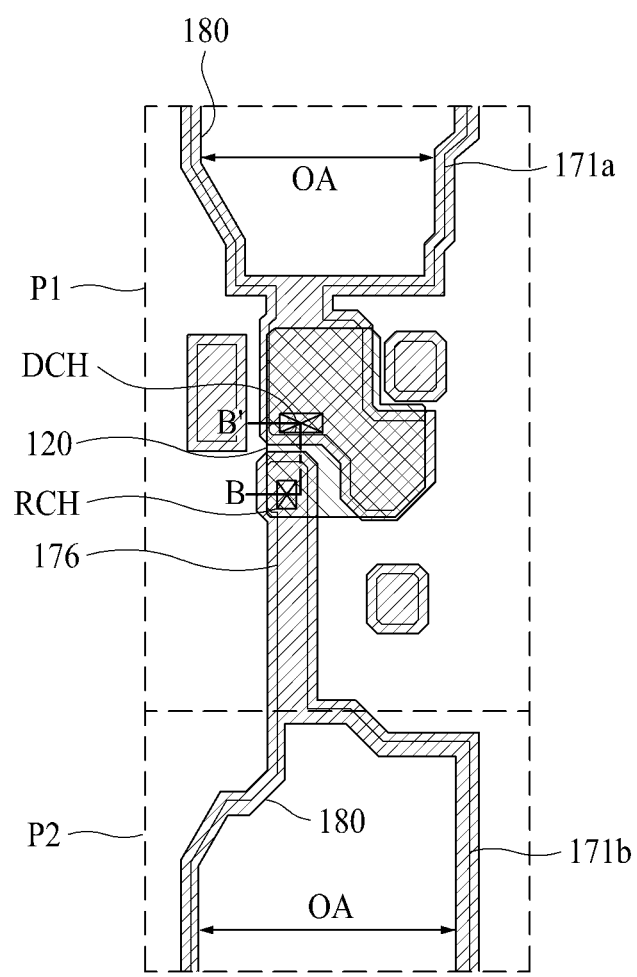
FIGS. 5A and 5B are exemplary views illustrating anodes provided in two adjacent pixels in a light emitting display panel according to the present disclosure.
Figure 5B:
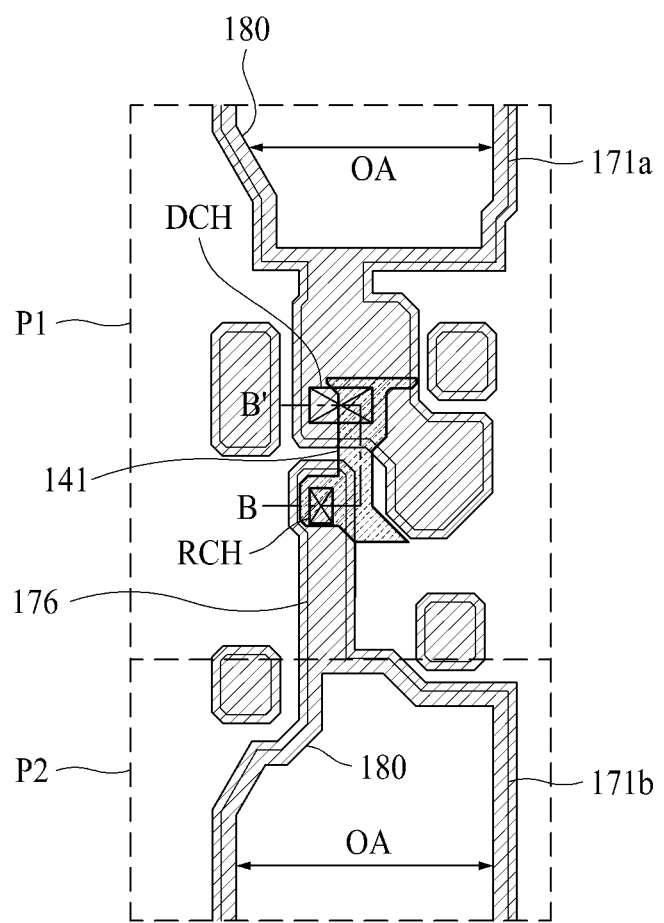

FIG. 4 is an exemplary view illustrating two pixels that are repaired in a light emitting display panel according to the present disclosure. FIGS. 5A and 5B are exemplary views illustrating anodes provided in two adjacent pixels in a light emitting display panel according to the present disclosure. In this case, the anodes 171a and 171b and the driving light-shielding electrode 120, which are provided in the two pixels, are schematically illustrated in FIG. 5B to describe a method for connecting anodes provided in two pixels. Also, the anodes 171a and 171b and the first electrode 141, which are provided in the two pixels, are schematically illustrated in FIG. 5B to describe a method for connecting anodes provided in two pixels. Each of the pixels applied to the present disclosure includes a pixel driving circuit PDC and a light emitting element ED, as shown in FIG. 2. Therefore, the pixel driving circuit and the light emitting element are provided in each of the two pixels P1 and P2 shown in FIG. 4.

In the following description, one of the two pixels P1 and P2 shown in FIG. 4 will be referred to as a first pixel P1 and the other one of the two pixels P1 and P2 shown in FIG. 4 will be referred to as a second pixel P2. In this case, the pixel driving circuit of the second pixel P2 may not be normally driven, the light emitting element ED may be normally driven, and the pixel driving circuit and the light emitting element ED of the first pixel P1 may be normally driven. Therefore, in the following description, the first pixel P1 will be referred to as a normal pixel, and the second pixel P2 will be referred to as a defective pixel.

Also, in the following description, the anode provided in the first pixel P1 will be referred to as a first anode and marked with 171a, and the anode provided in the second pixel P2 will be referred to as a second anode and marked with 171b.

When the first pixel P1 and the second pixel P2 are adjacent to each other and the second pixel P2 is a defective pixel, the second anode 171b of the light emitting element ED formed in the second pixel P2 is connected to the first electrode 141 of the driving transistor Tdr formed in the first pixel P1 by a repair process, as shown in FIG. 4.

In addition, the second anode 171b provided in the second pixel P2 is separated from the first electrode 141 of the driving transistor Tdr provided in the second pixel P2 through the repair process.

In this case, the light emitting element ED provided in the first pixel P1 is connected to the first electrode 141 of the driving transistor Tdr provided in the first pixel P1.

Therefore, the light emitting element ED provided in the second pixel P2 and the light emitting element ED provided in the first pixel P1 may normally be driven by the driving transistor Tdr provided in the first pixel P1.

The repair process applied to the present disclosure will briefly be described as follows.

First, before the repair process is performed, as shown in FIG. 5A, the first anode 171a provided in the first pixel P1 and the second anode 171b provided in the second pixel P2 are separated from each other. That is, the repair line 176 provided in the first pixel P1 and connected with the second anode 171b of the second pixel P2 is separated from the first anode 171a of the first pixel P1. Therefore, the first anode 171a and the second anode 171b are separated from each other.

In this case, the first anode 171a is connected with the first electrode 141 provided in the first pixel P1, and the second anode 171b is connected with the first electrode 141 provided in the second pixel P2.

Figure 7:
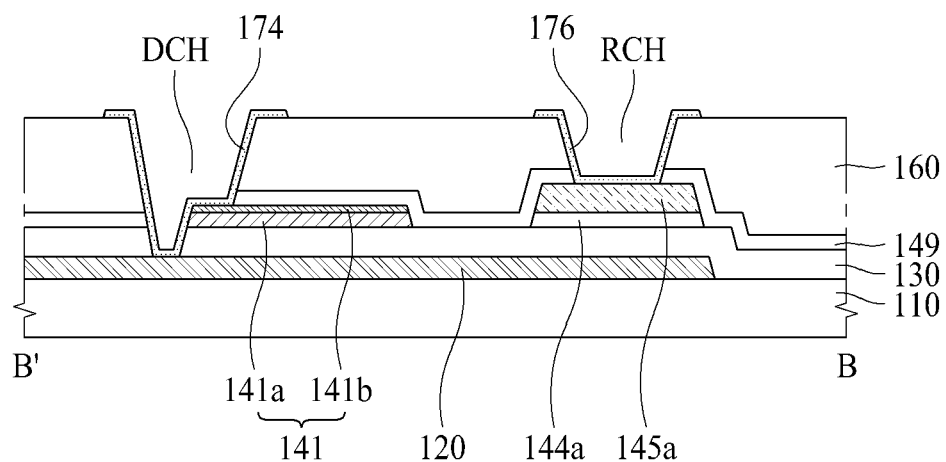
FIGS. 7 to 8B are exemplary views illustrating a cross-section taken along line B-B' shown in FIG. 6.

Therefore, the first anode 171a and the second anode 171b are driven separately. In this case, the cross-section of line B-B' shown in FIG. 5A before the repair process is performed is shown in FIG. 7.

In the repair process, the first anode 171a may be connected with the repair line 176 connected with the second anode 171b provided in the second pixel P2 by the driving light-shielding electrode 120. That is, as shown in FIG. 5A, the driving light-shielding electrode 120 is provided to overlap a driving contact hole DCH connected with the first anode 171a and a repair contact hole RCH connected with the second anode 171b through the repair line 176. Therefore, the driving contact hole DCH and the repair contact hole RCH may electrically be connected with each other by the driving light-shielding electrode 120, and thus the first anode 171a and the second anode 171b may electrically be connected with each other. In this case, the second anode 171b is electrically separated from the pixel driving circuit provided in the second pixel P2.

Figure 8A:
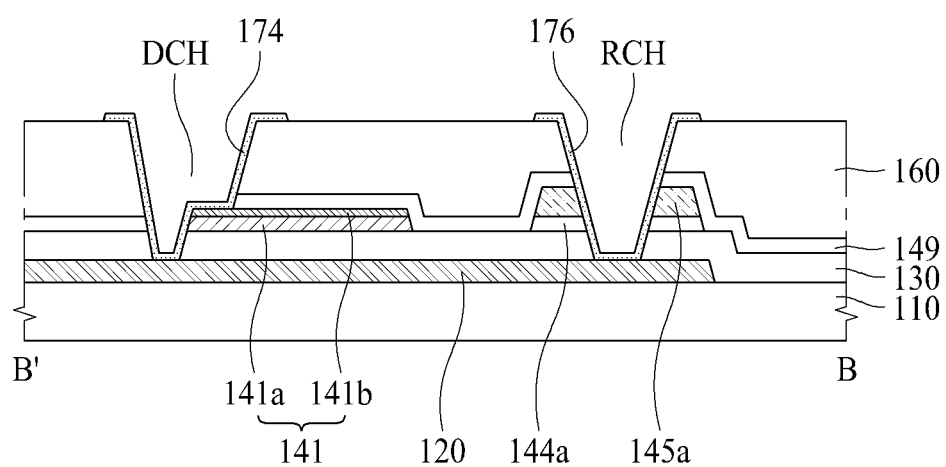
Figure 8B:
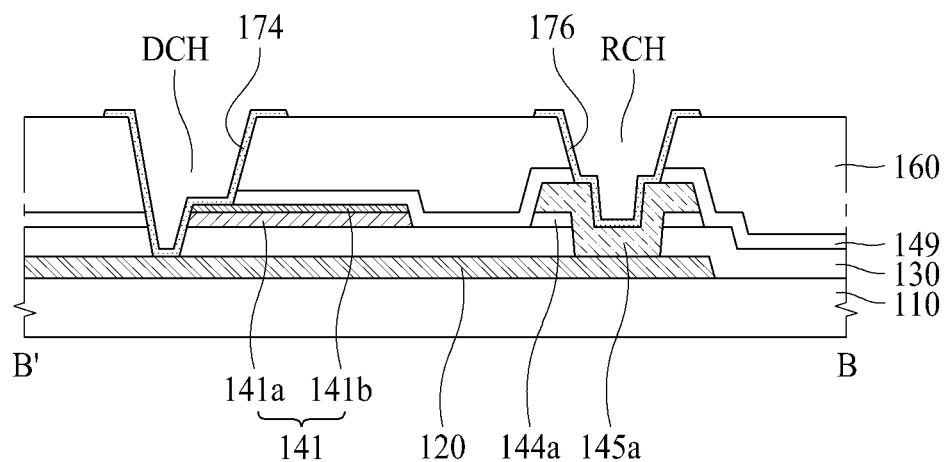

As described above, the second anode 171b may be connected with the first electrode 141 provided in the first pixel P1. Therefore, both the first anode 171a and the second anode 171b may be connected with the first electrode 141 of the driving transistor Tdr provided in the first pixel P1, and thus the first anode 171a and the second anode 171b may normally be driven by the driving transistor Tdr provided in the first pixel P1. In this case, the cross-section of line B-B' shown in FIG. 5A after the repair process is performed is shown in FIGS. 8A and 8B.

Second, before the repair process is performed, as shown in FIG. 5B, the first anode 171a provided in the first pixel P1 and the second anode 171b provided in the second pixel P2 are separated from each other. That is, the repair line 176 provided in the first pixel P1 and connected with the second anode 171b of the second pixel P2 is separated from the first anode 171a of the first pixel P1. Therefore, the first anode 171a and the second anode 171b are separated from each other.

In this case, the first anode 171a is connected with the first electrode 141 provided in the first pixel P1, and the second anode 171b is connected with the first electrode 141 provided in the second pixel P2.

Figure 11:
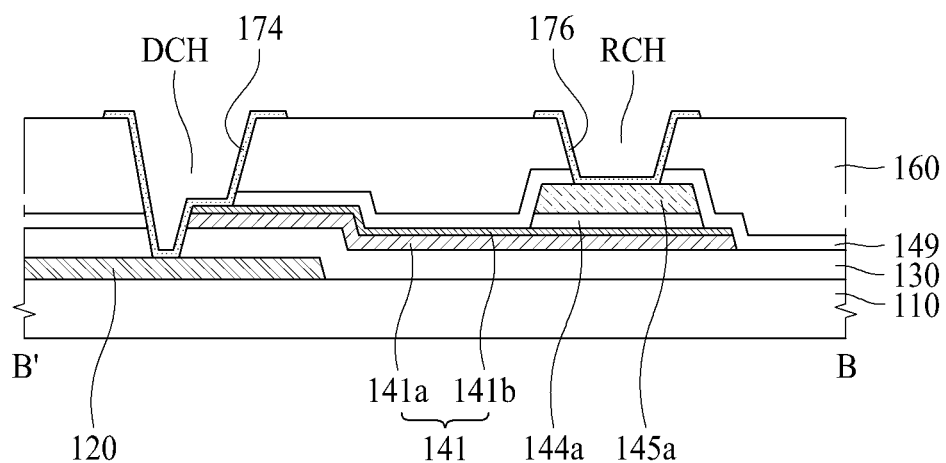
FIGS. 11 to 12B are exemplary views illustrating a cross-section taken along line B-B' shown in FIG. 10.

Therefore, the first anode 171a and the second anode 171b are driven separately. In this case, the cross section of line B-B' shown in FIG. 5B before the repair process is performed is shown in FIG. 11.

In the repair process, the first anode 171a may be connected with the repair line 176 connected with the second anode 171b provided in the second pixel P2 by the first electrode 141. That is, as shown in FIG. 5B, the first electrode 141 is provided to overlap the driving contact hole DCH connected with the first anode 171a and the repair contact hole RCH connected with the second anode 171b through the repair line 176. Therefore, the driving contact hole DCH and the repair contact hole RCH may electrically be connected with each other by the first electrode 141, and thus the first anode 171a and the second anode 171b may electrically be connected with each other. In this case, the second anode 171b is electrically separated from the pixel driving circuit provided in the second pixel P2.

Figure 12A:
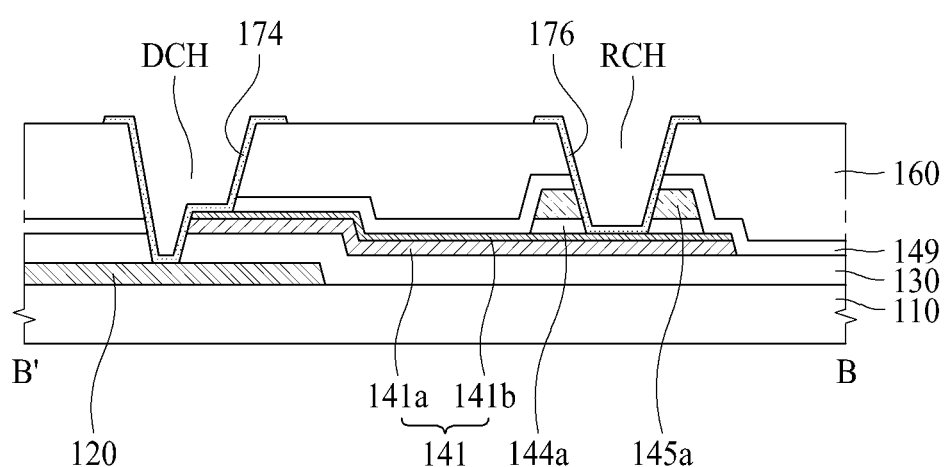
Figure 12B:
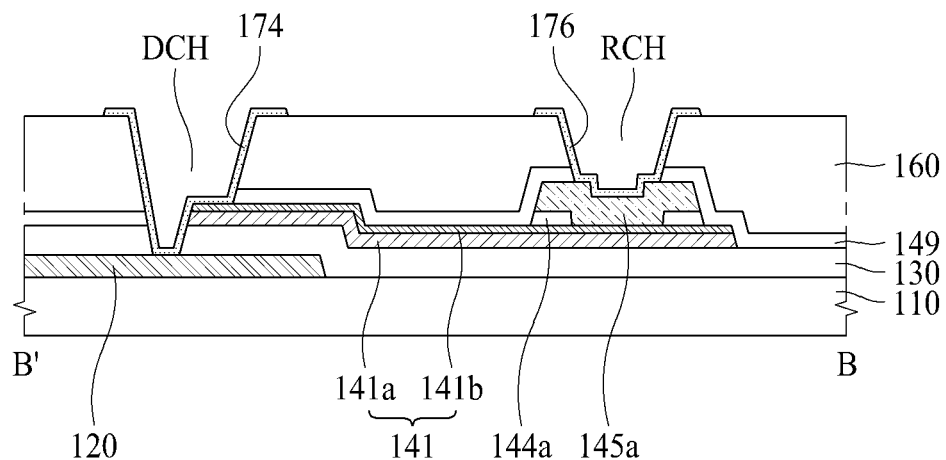

As described above, the second anode 171b may be connected with the first electrode 141 provided in the first pixel P1. Therefore, both the first anode 171a and the second anode 171b may be connected with the first electrode 141 of the driving transistor Tdr provided in the first pixel P1, whereby the first anode 171a and the second anode 171b may normally be driven by the driving transistor Tdr provided in the first pixel P1. In this case, the cross-section of line B-B' shown in FIG. 5B after the repair process is performed is shown in FIGS. 12A and 12B.

Hereinafter, the embodiment in which the repair line 176 is connected with the first electrode 141, the first anode 171a and the second anode 171b through the driving light-shielding electrode 120 through the repair process will be described with reference to FIGS. 5A and 6 to 9E, and the embodiment in which the repair line 176 is directly connected with the first electrode 141 and connected with the first anode 171a and the second anode 171a through the repair process will be described with reference to FIGS. 5B and 10 to 13E.

Figure 6:
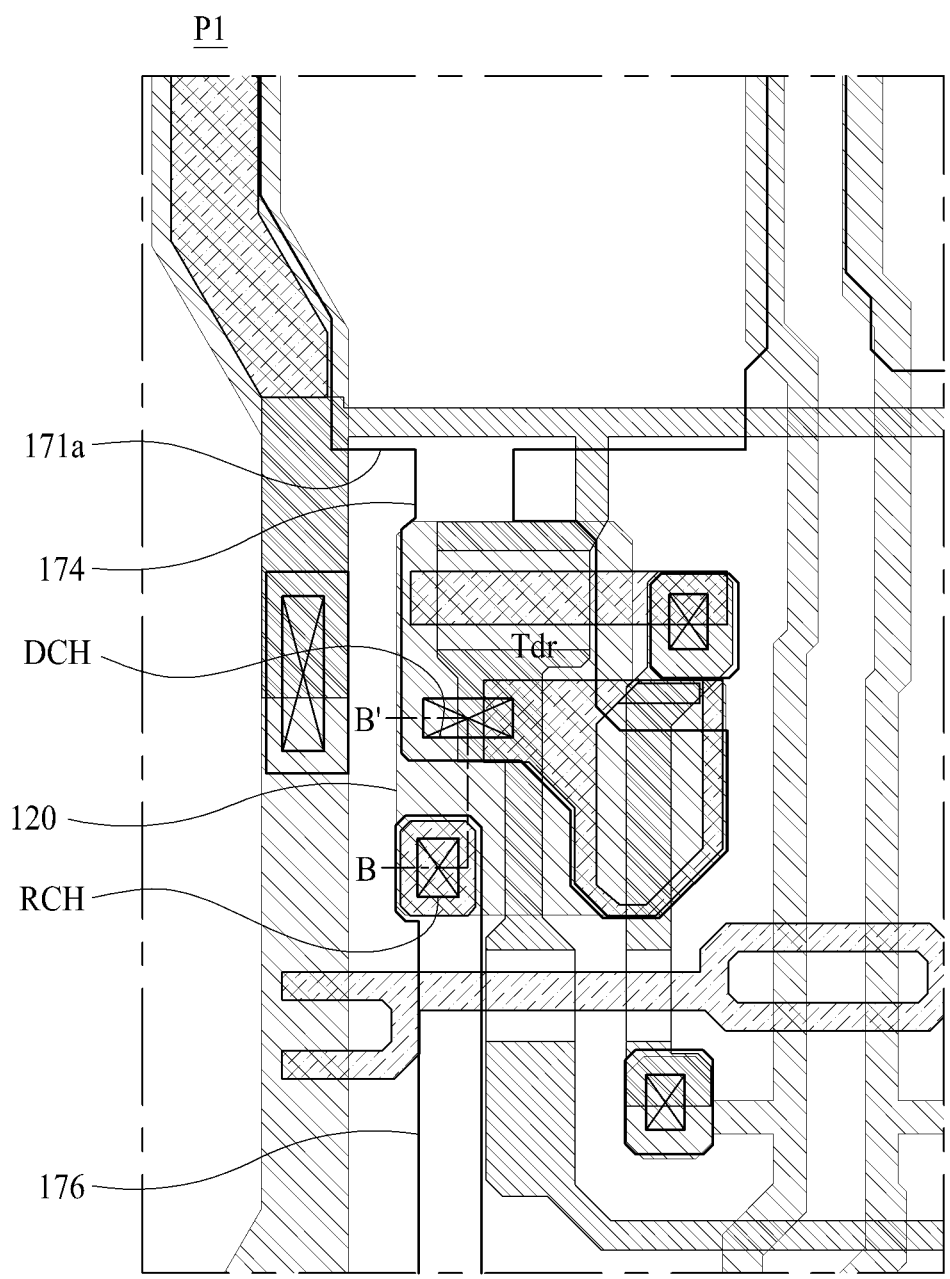
FIG. 6 is an exemplary view illustrating a plane of a first pixel provided in a light emitting display panel according to the present disclosure.

FIG. 6 is an exemplary view illustrating a plane of a first pixel provided in a light emitting display panel according to the present disclosure, FIGS. 7 to 8B are exemplary views illustrating a cross-section taken along line B-B' shown in FIG. 6, and FIGS. 9A to 9E are exemplary views illustrating a method of manufacturing a light emitting display panel shown in FIGS. 6 and 7. In particular, FIG. 7 shows a cross-section taken along line B-B' when a repair process for the first pixel P1 shown in FIG. 6 is not performed, and FIGS. 8A and 8B show cross-sectional views taken along line B-B' when the repair process for the first pixel P1 shown in FIG. 6 is performed.

In the following description, the same or similar elements as or to those described with reference to FIGS. 1 to 5A will be omitted or briefly described. In particular, the following description will be based on the first pixel P1 described with reference to FIGS. 4 and 5A by way of example.

The light emitting display panel 100 according to the present disclosure, as described above, includes a substrate 110 including a non-display area 103 and a display area 102 provided with pixels 101, a driving light-shielding electrode 120 provided in the substrate in the form of a pattern, a buffer 130 covering the driving light-shielding electrode 120, a pixel driving circuit layer 140 provided in the buffer 130, including a driving transistor Tdr connected with the driving light-shielding electrode 120, a planarization layer 160 covering the pixel driving circuit layer 140, an anode 171 provided in the planarization layer 160 and connected with the driving light-shielding electrode 120 and the driving transistor Tdr, a repair line 176 provided in the planarization layer 160, a bank 180 forming an opening area OA from which the anode 171 is exposed, by covering an outer portion of the anode 171, a light emitting layer 172 provided on the anode 171 and the bank 180, and a cathode 173 provided on the light emitting layer.

First, when the repair process for the first pixel P1 is not performed, a structure of the first pixel P1 is as follows.

When the repair process for the first pixel P1 is not performed, the repair line 176 provided in the first pixel P1 is connected with an island-shaped contact electrode 145a provided below the repair line 176, and the contact electrode 145a is separated from the driving light-shielding electrode 120 by the buffer 130, as shown in FIG. 7. In more detail, at least one insulating layer may be provided between the contact electrode 145a and the driving light-shielding electrode 120 provided below the contact electrode 145a, and the insulating layer may be the buffer 130. A contact electrode insulating layer 144a formed through the same process as that of the gate insulating layer 144 may further be provided between the contact electrode 145a and the buffer 130.

As shown in FIGS. 5A, 6 and 7, the repair line 176 is connected with the second anode 171b provided in the second pixel P2 adjacent to the first pixel P1.

As shown in FIG. 7, the repair line 176 is connected with the contact electrode 145a in the repair contact hole RCH that passes through the passivation layer 149, which is provided in the pixel driving circuit layer 140 to cover the driving transistor Tdr, and the planarization layer 160.

In this case, as shown in FIGS. 6 and 7, the first electrode 141 constituting the driving transistor Tdr provided in the first pixel P1 and the light-shielding electrode 120 are connected with the first anode 171a through the anode line 174 provided in the driving contact hole DCH that passes through the planarization layer 160, the pixel driving circuit layer 140 (particularly, passivation layer 149) and the buffer 130.

Second, when the repair process for the first pixel P1 is performed, the structure of the first pixel P1 is as follows.

When the repair process for the first pixel P1 is performed, as shown in FIG. 8A, the repair line 176 may electrically be connected with the driving light-shielding electrode 120 through the repair contact hole RCH that passes through the passivation layer 149, which is provided in the pixel driving circuit layer 140 to cover the driving transistor, the planarization layer 160 and the contact electrode 145a.

When the contact electrode insulating layer 144a formed through the same process as that of the gate insulating layer 144 is further provided between the contact electrode 145a and the buffer 130, the repair contact hole RCH passes through the contact electrode insulating layer 144a.

Therefore, the repair line 176 is connected with the driving light-shielding electrode 120.

Also, when the repair process for the first pixel P1 is performed, as shown in FIG. 8*b*, the repair line 176 may electrically be connected with the driving light-shielding electrode 120 through the contact electrode 145*a* recessed in the contact hole RCH. For example, in the repair process, when a laser is irradiated to the light emitting display panel shown in FIG. 7, the buffer 130 provided in the contact hole RCH may be cut. In this case, the contact electrode 145*a* and the repair line 176 are recessed through the cut gap, whereby the contact electrode 145*a* may be connected with the driving light-shielding electrode 120. In more detail, the repair line 176 may be connected with the contact electrode 145*a* through the repair contact hole RCH that passes through the passivation layer 149 provided in the pixel driving circuit layer to cover the driving transistor and the planarization layer 160, and may electrically be connected with the driving light-shielding electrode 120 through the contact electrode 145*a* which is recessed by passing through the insulating layer (buffer 130 or the buffer 130 and the contact electrode insulating layer 144*a*) below the repair contact hole RCH.

When the contact electrode insulating layer 144*a* formed through the same process as that of the gate insulating layer 144 is further provided between the contact electrode 145*a* and the buffer 130, the contact electrode insulating layer 144*a* and the buffer 130 are cut in the repair process, and the contact electrode 145*a* may be recessed through the cut gap and thus connected with the light-shielding electrode 120.

Therefore, the repair line 176 connected with the contact electrode 145*a* is connected with the driving light-shielding electrode 120.

As described above, the driving light-shielding electrode 120 is connected with the first electrode 141 of the driving transistor Tdr.

Therefore, the repair line 176 may also electrically be connected with the first electrode 141 of the driving transistor Tdr through the repair process.

In this case, the first electrode 141 is connected with the first anode 171*a* provided in the first pixel P1 through the anode line 174, and is connected with the second anode 171*b* provided in the second pixel P2 through the anode line 174, the driving light-shielding electrode 120 and the repair line 176.

That is, the first electrode 141 of the driving transistor Tdr provided in the first pixel P1 may be connected with the first anode 171*a* provided in the first pixel P1, and may also be connected with the second anode 171*b* provided in the second pixel P2 through the repair process. Therefore, the light emitting element ED provided in the second pixel P2 (defective pixel) may normally be driven by the driving transistor Tdr provided in the first pixel P1 (normal pixel).

According to the present disclosure described as above, in the manufacturing process of the light emitting display panel in which the planarization layer 160, the passivation layer 149 and the buffer 130 are etched to form contact holes, the buffer 130 provided below the repair line 176 is not etched by the contact electrode 145*a* provided between the repair line 176 and the buffer 130. The repair line 176 is provided to connect the driving transistor Tdr of the normal pixel (first pixel P1) with the light emitting element ED of the defective pixel (second pixel P2).

Therefore, as shown in FIG. 7, the repair line 176 provided in the first pixel P1 that is not repaired is not electrically connected with other electrodes provided in the first pixel P1. As a result, the light emitting elements respectively provided in the first pixel P1 provided with the repair line 176 and the second pixel P2 may be driven independently.

However, as shown in FIG. 8A or FIG. 8B, the repair line 176 provided in the first pixel P1 that is repaired may be connected with the driving light-shielding electrode 120 through the repair contact hole RCH. In this case, since the driving light-shielding electrode 120 is connected with the first electrode 141 of the driving transistor Tdr provided in the normal pixel (first pixel P1) and the repair line 176 is connected with the second anode 171*b* of the defective pixel (second pixel P2), the second anode 171*b* of the defective pixel may normally be driven by the driving transistor Tdr provided in the normal pixel.

Hereinafter, the manufacturing process of the first pixel P1 described with reference to FIGS. 6 and 7 will briefly be described with reference to FIGS. 9A to 9E. The manufacturing process of the first pixel P1 shown in FIGS. 6 and 7 is substantially the same as the manufacturing process of the light emitting display panel according to the present disclosure described with reference to FIGS. 3A to 3E, and thus a manufacturing process for the structures shown in FIGS. 6 and 7 will be described below. Therefore, in the description of FIGS. 9A to 9E, the same or similar elements as or to those described with reference to FIGS. 3A to 3E will be omitted or briefly described.

Figure 9A:
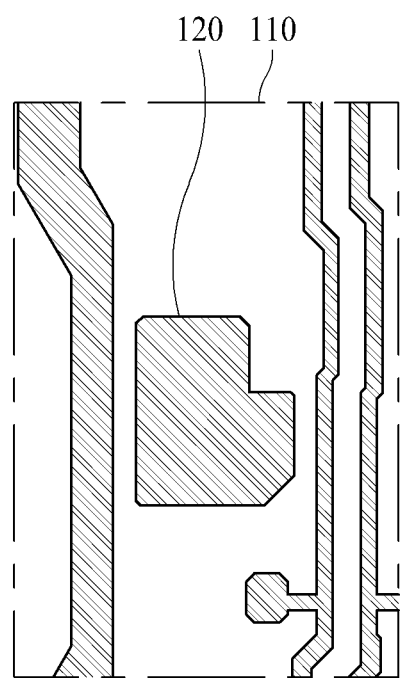
FIGS. 9A to 9E are exemplary views illustrating a method of manufacturing a light emitting display panel shown in FIGS. 6 and 7.

First, as shown in FIG. 9A, the driving light-shielding electrode 120 is provided on the substrate 110. In this case, the pad light-shielding electrode 121 and various elements may be provided on the substrate 110 together with the driving light-shielding electrode 120. The driving light-shielding electrode 120 may be formed of various types of metals.

Figure 9B:
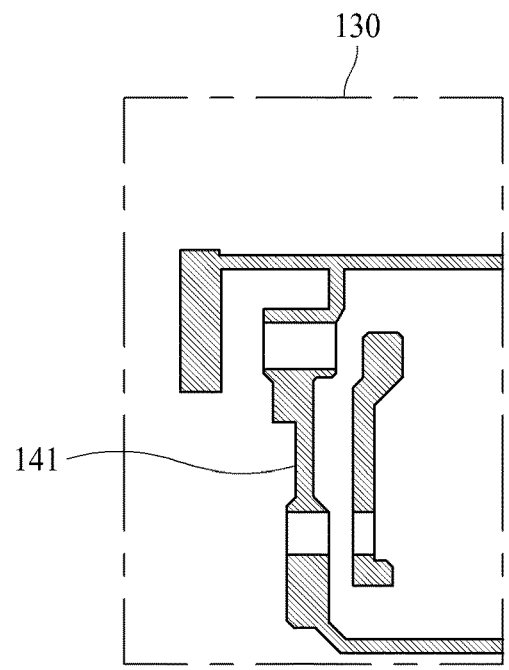

As shown in FIG. 9B, the driving light-shielding electrode 120 is covered by the buffer 130, and the semiconductor materials forming the semiconductor layer 143, the first electrode 141 and the second electrode 142, which constitute the driving transistor Tdr, are provided on the upper end of the buffer 130. In a subsequent process, ions may be implanted into the semiconductor material or ultraviolet rays may be irradiated to the semiconductor material, whereby the first electrode 141 and the second electrode 142 may be formed.

Figure 9C:
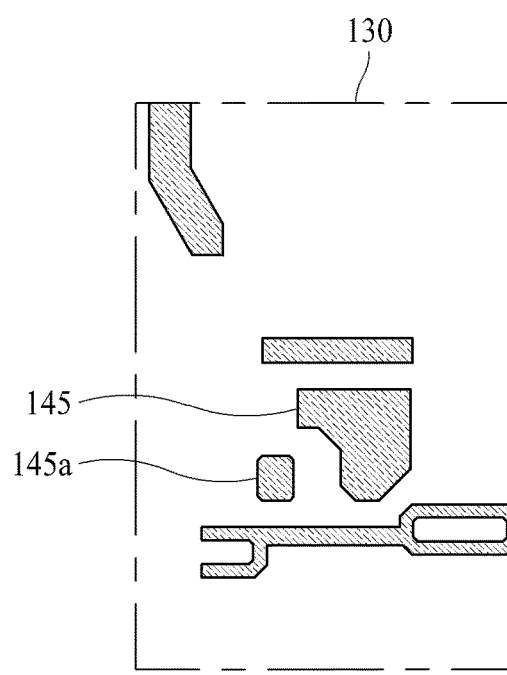

Next, as shown in FIG. 9*c*, the gate 145 and the contact electrode 145*a* are provided. That is, the gate 145 and the contact electrode 145*a* are formed of the same material and are simultaneously formed through the same process. The gate 145 and the contact electrode 145*a* may be formed of various types of metals.

Figure 9D:
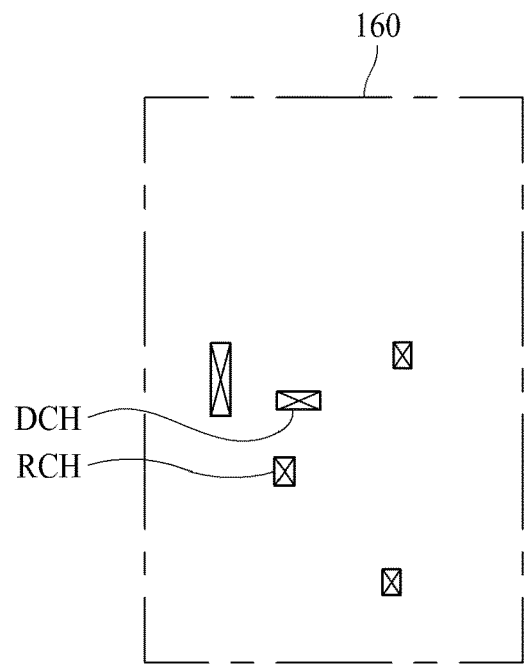

Next, the gate 145 and the contact electrode 145*a* are covered by the passivation layer 149, the passivation layer 149 is covered by the planarization layer 160, and the planarization layer 160, the pixel driving circuit layer 140 (particularly, passivation layer 149) and the buffer 130 are etched to form the driving contact hole DCH and the repair contact hole RCH as shown in FIG. 9D. Each of the passivation layer 149 and the planarization layer 160 may be comprised of at least one of various types of inorganic materials and organic materials.

Figure 9E:
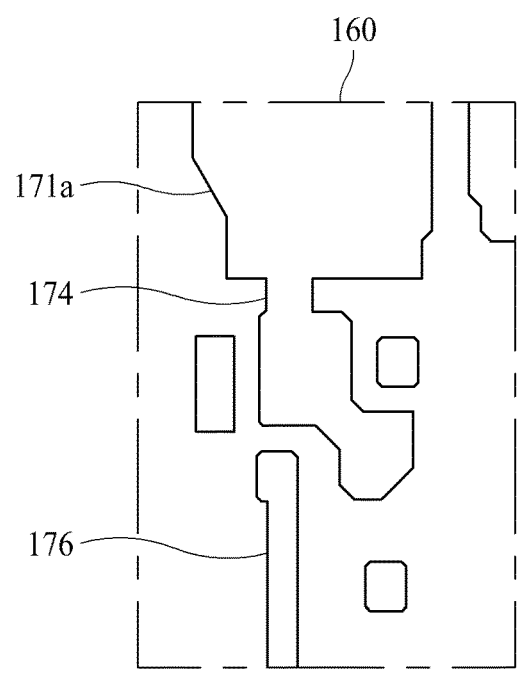

Finally, as shown in FIG. 9E, the first anode 171*a*, the anode line 174 and the repair line 176 are provided on the upper end of the planarization layer 160. The first anode 171*a*, the anode line 174 and the repair line 176 may be formed of at least one of various types of opaque metals or various types of transparent metals.

The bank 180 is provided on upper ends of the first anode 171*a*, the anode line 174 and the repair line 176, the light emitting layer 172 and the cathode 173 are provided to cover the first anode 171a and the bank 180, and the cathode 173 is covered by the encapsulation layer, whereby the first pixel P1 shown in FIGS. 6 and 7 may be manufactured.

The first pixel P1 described as above has the following features.

In the first pixel P1, the first electrode 141 and the contact electrode 145a are spaced apart from each other on the upper end of the buffer 130 as shown in FIGS. 7, 8A, and 8B.

Also, when the repair process is performed, as shown in FIG. 8A, the repair line 176 provided in the first pixel P1 is connected with the second anode 171b provided in the second pixel adjacent to the first pixel P1, the repair line 176 provided in the first pixel P1 is connected with the driving light-shielding electrode 120 through the repair contact hole RCH that passes through the passivation layer 149 provided in the pixel driving circuit layer 140 to cover the driving transistor Tdr, the planarization layer 160, the contact electrode 145a and the buffer 130, and the driving light-shielding electrode 120 is connected with the first electrode 141 through the anode line 174 provided in the driving contact hole DCH. However, the repair line 176, as shown in FIG. 8B, may electrically be connected with the driving light-shielding electrode 120 through the contact electrode 145a recessed in the contact hole RCH.

In this case, the first electrode 141 includes a first active layer 141a provided on one side of the semiconductor layer 143 constituting the driving transistor Tdr, and a first conductor layer 141b provided on an upper end of the first active layer 141a.

The anode line 174 connected with the first anode 171a is connected with the first electrode 141 and the driving light-shielding electrode 120 in the driving contact hole DCH.

Figure 10:
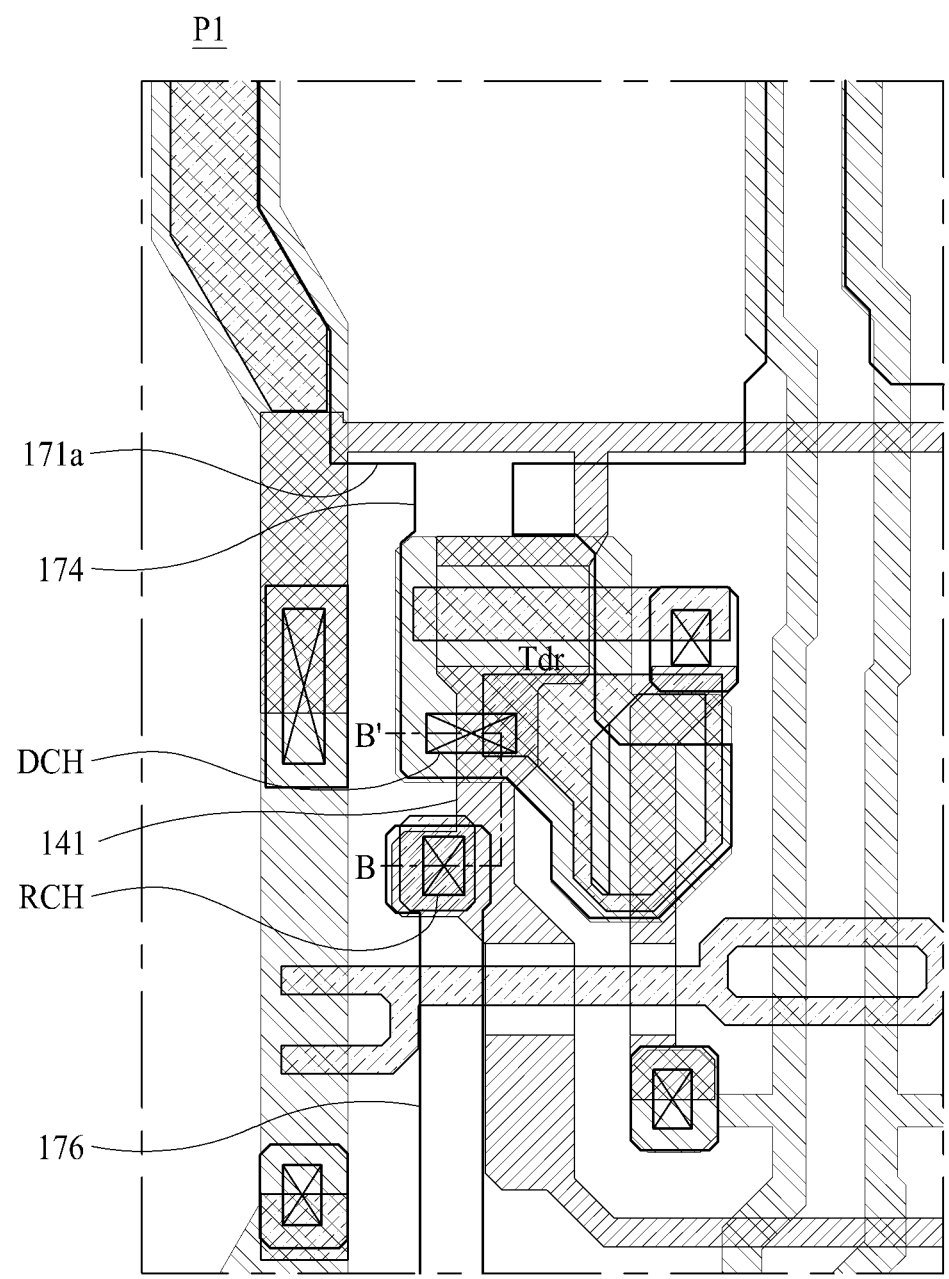
FIG. 10 is another exemplary view illustrating a plane of a first pixel provided in a light emitting display panel according to the present disclosure.

FIG. 10 is another exemplary view illustrating a plane of a first pixel provided in a light emitting display panel according to the present disclosure, FIGS. 11 to 12B are exemplary views illustrating a cross-section taken along line B-B' shown in FIG. 10, and FIGS. 13A to 13E are exemplary views illustrating a method of manufacturing a light emitting display panel shown in FIGS. 10 and 11. In particular, FIG. 11 shows a cross-section taken along line B-B' when a repair process for the first pixel P1 shown in FIG. 10 is not performed, and FIGS. 12A and 12B show cross-sections taken along line B-B' when a repair process for the first pixel P1 shown in FIG. 10 is performed.

In the following description, the same or similar elements as or to those described with reference to FIGS. 1, 4 and 5B will be omitted or briefly described. In particular, the following description will be based on the first pixel P1 described with reference to FIGS. 4 and 5B by way of example.

The light emitting display panel 100 according to the present disclosure, as described above, includes a substrate 110 including a non-display area 103 and a display area 102 provided with pixels 101, a driving light-shielding electrode 120 provided in the substrate in the form of a pattern, a buffer 130 covering the driving light-shielding electrode 120, a pixel driving circuit layer 140 provided in the buffer 130, including a driving transistor Tdr connected with the driving light-shielding electrode 120, a planarization layer 160 covering the pixel driving circuit layer 140, an anode 171 provided in the planarization layer 160 and connected with the driving light-shielding electrode 120 and the driving transistor Tdr, a repair line 176 provided in the planarization layer 160, a bank 180 forming an opening area OA from which the anode 171 is exposed, by covering an outer portion of the anode 171, a light emitting layer 172 provided on the anode 171 and the bank 180, and a cathode 173 provided on the light emitting layer.

First, when the repair process for the first pixel P1 is not performed, a structure of the first pixel P1 is as follows.

When the repair process for the first pixel P1 is not performed, as shown in FIG. 11, the repair line 176 provided in the first pixel P1 is connected with an island-shaped contact electrode 145a provided below the repair line 176, and the contact electrode 145a is separated from the driving light-shielding electrode 120 by the buffer 130.

In this case, the first electrode 141 is extended below the contact electrode 145a. That is, the contact electrode 145a is overlapped with the first electrode 141.

A contact electrode insulating layer 144a formed through the same process as that of the gate insulating layer 144 is provided between the contact electrode 145a and the first electrode 141. Therefore, the contact electrode 145a and the first electrode 141 are insulated from each other. That is, at least one insulating layer may be provided between the contact electrode 145a and the first electrode 141 provided below the contact electrode 145a, and may be the gate insulating layer 144.

As shown in FIGS. 5B, 10 and 11, the repair line 176 is connected with the second anode 171b provided in the second pixel P2 adjacent to the first pixel P1.

As shown in FIG. 11, the repair line 176 is connected with the contact electrode 145a in the repair contact hole RCH that passes through the passivation layer 149, which is provided in the pixel driving circuit layer 140 to cover the driving transistor Tdr, and the planarization layer 160.

In this case, as shown in FIGS. 10 and 11, the first electrode 141 constituting the driving transistor Tdr and the light-shielding electrode 120 are connected with the first anode 171a through the anode line 174 provided in the driving contact hole DCH that passes through the planarization layer 160, the pixel driving circuit layer 140 and the buffer 130.

Second, when the repair process for the first pixel P1 is performed, the structure of the first pixel P1 is as follows.

When the repair process for the first pixel P1 is performed, as shown in FIG. 12A, the repair line 176 may electrically be connected with the first electrode 141 through the repair contact hole RCH that passes through the passivation layer 149, which is provided in the pixel driving circuit layer 140 to cover the driving transistor, the planarization layer 160, the contact electrode 145a and the contact electrode insulating layer 144a.

Therefore, the repair line 176 may electrically be connected with the first electrode 141 of the driving transistor Tdr provided in the first pixel P1.

Also, when the repair process for the first pixel P1 is performed, as shown in FIG. 12B, the repair line 176 may electrically be connected with the first electrode 141 through the contact electrode 145a recessed in the contact hole RCH. For example, in the repair process, when a laser is irradiated to the light emitting display panel shown in FIG. 11, the contact electrode insulating layer 144a provided in the contact hole RCH may be cut. In this case, the contact electrode 145a and the repair line 176 are recessed through the cut gap, whereby the contact electrode 145a may be connected with the first electrode 141.

Therefore, the repair line 176 connected with the contact electrode 145a is connected with the driving light-shielding electrode 120.

The first electrode 141 is connected with the driving light-shielding electrode 120 through the anode line 174.

In this case, the first electrode 141 is connected with the first anode 171a provided in the first pixel P1 through the anode line 174, and is connected with the second anode 171b provided in the second pixel P2 through the repair line 176.

That is, the first electrode 141 of the driving transistor Tdr provided in the first pixel P1 may be connected with the first anode 171a provided in the first pixel P1, and may also be connected with the second anode 171b provided in the second pixel P2 through the repair process. Therefore, the light emitting element ED provided in the second pixel P2 (defective pixel) may normally be driven by the driving transistor Tdr provided in the first pixel P1 (normal pixel).

According to the present disclosure described as above, in the manufacturing process of the light emitting display panel in which the planarization layer 160, the passivation layer 149 and the buffer 130 are etched to form contact holes, the buffer 130 provided below the repair line 176 is not etched by the contact electrode 145a provided below the repair line 176 and the first electrode 141. The repair line 176 is provided to connect the driving transistor Tdr of the normal pixel (first pixel P1) with the light emitting element ED of the defective pixel (second pixel P2).

Therefore, as shown in FIG. 11, the repair line 176 provided in the first pixel P1 that is not repaired is not electrically connected with other electrodes provided in the first pixel P1. As a result, the light emitting elements respectively provided in the first pixel P1 provided with the repair line 176 and the second pixel P2 may be driven independently.

However, as shown in FIG. 12A and FIG. 12B, the repair line 176 provided in the first pixel P1 that is repaired may be connected with the first electrode 141 through the repair contact hole RCH.

In this case, since the first electrode 141 is connected with the driving transistor Tdr provided in the normal pixel (first pixel P1) and the repair line 176 is connected with the second anode 171b of the defective pixel (second pixel P2), the second anode 171b of the defective pixel may normally be driven by the driving transistor Tdr provided in the normal pixel.

Hereinafter, the manufacturing process of the first pixel P1 described with reference to FIGS. 10 and 11 will briefly be described with reference to FIGS. 13A to 13E. The manufacturing process of the first pixel P1 shown in FIGS. 10 and 11 is substantially the same as the manufacturing process of the light emitting display panel according to the present disclosure described with reference to FIGS. 3A to 3E, and thus a manufacturing process for the structures shown in FIGS. 10 and 11 will be described below. Therefore, in the description of FIGS. 13A to 13E, the same or similar elements as or to those described with reference to FIGS. 3A to 3E and FIGS. 9A to 9E will be omitted or briefly described.

Figure 13A:
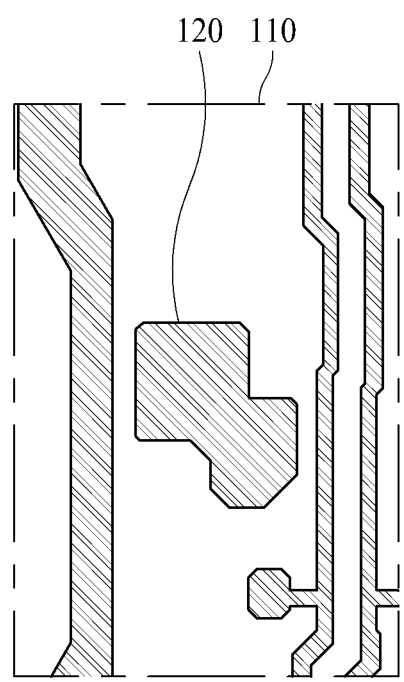
FIGS. 13A to 13E are exemplary views illustrating a method of manufacturing a light emitting display panel shown in FIGS. 10 and 11.

First, as shown in FIG. 13A, the driving light-shielding electrode 120 is provided on the substrate 110.

Figure 13B:
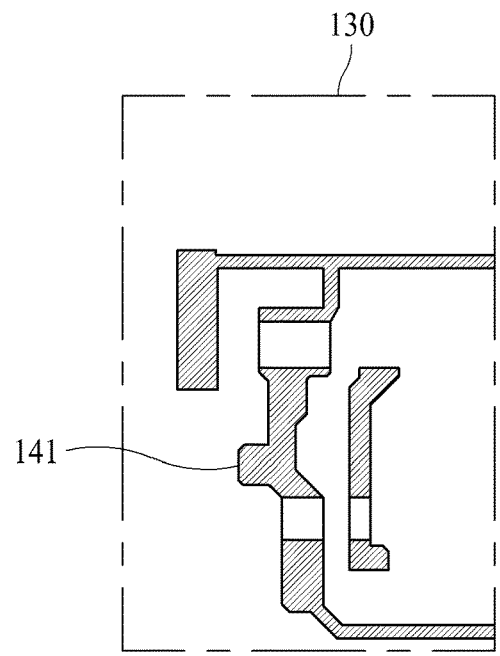

Next, as shown in FIG. 13B, the driving light-shielding electrode 120 is covered by the buffer 130, and the semiconductor materials forming the semiconductor layer 143, the first electrode 141 and the second electrode 142, which constitute the driving transistor Tdr, are provided on the upper end of the buffer 130. In a subsequent process, ions may be implanted into the semiconductor material or ultraviolet rays may be irradiated to the semiconductor material, whereby the first electrode 141 and the second electrode 142 may be formed.

In this case, when the first electrode 141 shown in FIG. 13B is compared with the first electrode 141 shown in FIG. 9b, the first electrode 141 shown in FIG. 13B includes a portion further protruded toward a left direction of the drawings shown in FIGS. 9B and 13B. The protruded portion of the first electrode 141 shown in FIG. 13B is a portion overlapped with the contact electrode 145a as shown in FIG. 11. That is, in the first pixel P1 shown in FIGS. 10 and 11, the first electrode 141 is overlapped with the contact electrode 145a. However, in the first pixel P1 shown in FIGS. 6 and 7, the first electrode 141 is not overlapped with the contact electrode 145a.

As shown in FIGS. 10 and 11, when the first electrode 141 is overlapped with the contact electrode 145a, a separation space for separating the contact electrode 145a from the first electrode 141 is not required. Therefore, the opening area OA of the first pixel P1 may be increased as much as the separation space for separating the contact electrode 145a from the first electrode 141.

Figure 13C:
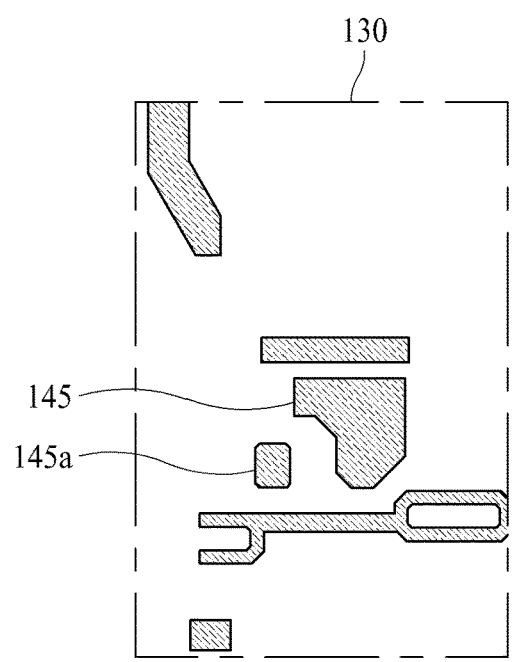

Next, as shown in FIG. 13C, the gate 145 and the contact electrode 145a are provided.

Figure 13D:
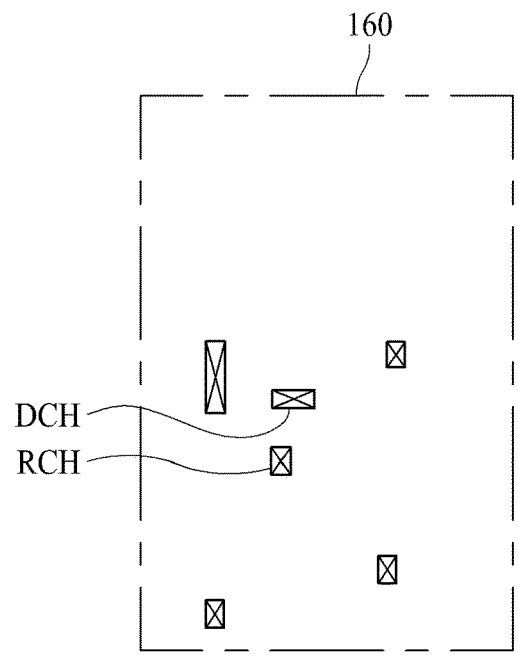

Next, the gate 145 and the contact electrode 145a are covered by the passivation layer 149, the passivation layer 149 is covered by the planarization layer 160, and the planarization layer 160, the pixel driving circuit layer 140 (particularly, passivation layer 149) and the buffer 130 are etched to form the driving contact hole DCH and the repair contact hole RCH as shown in FIG. 13D.

Figure 13E:
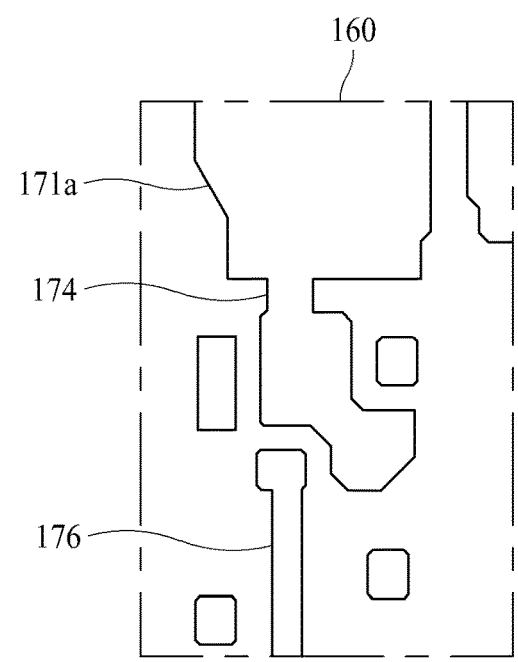

Finally, as shown in FIG. 13E, the first anode 171a, the anode line 174 and the repair line 176 are provided on the upper end of the planarization layer 160.

The bank 180 is provided on upper ends of the first anode 171a, the anode line 174 and the repair line 176, the light emitting layer 172 and the cathode 173 are provided to cover the first anode 171a and the bank 180, and the cathode 173 is covered by the encapsulation layer, whereby the first pixel P1 shown in FIGS. 10 and 11 may be manufactured.

The first pixel P1 described as above has the following features.

That is, the contact electrode 145a is provided on the upper end of the first electrode 141, the contact electrode insulating layer 144a is provided between the contact electrode 145a and the first electrode 141, and the driving contact hole DCH and the contact electrode (or repair contact hole RCH) are spaced apart from each other. That is, the contact electrode 145a is overlapped with the first electrode 141.

Therefore, a separation space for separating the contact electrode 145a from the first electrode 141 is not required, and thus the opening area OA of the first pixel P1 may be increased as much as the separation space for separating the contact electrode 145a from the first electrode 141.

Also, when the repair process is performed, as shown in FIG. 12A, the repair line 176 provided in the first pixel P1 is connected with the second anode 171b provided in the second pixel P2 adjacent to the first pixel P1, the repair line 176 provided in the first pixel P1 is connected with the first electrode 141 through the repair contact hole RCH that passes through the passivation layer 149 provided in the pixel driving circuit layer 140 to cover the driving transistor Tdr, the planarization layer 160, the contact electrode 145a and the contact electrode insulating layer 144a, and the first electrode 141 is connected with the driving light-shielding electrode 120 through the anode line 174 provided in the driving contact hole DCH. However, the repair line 176, as shown in FIG. 12B, may electrically be connected with the first electrode 141 through the contact electrode 145a recessed in the contact hole RCH, and the first electrode 141 may electrically be connected with the driving light-shielding electrode 120 through the anode line 174 provided in the driving contact hole DCH.

In this case, the first electrode 141 includes a first active layer 141*a* provided on one side of the semiconductor layer 143 constituting the driving transistor Tdr, and a first conductor layer 141*b* provided on an upper end of the first active layer 141*a*.

The anode line 174 connected with the first anode 171*a* is connected with the first electrode 141 and the driving light-shielding electrode 120 in the driving contact hole DCH.

According to the present disclosure described as above, in the manufacturing process of the light emitting display panel in which the planarization layer, the passivation layer and the buffer are etched to form contact holes, the buffer 130 provided below the repair line 176 is not etched by the contact electrode 145*a* provided below the repair line 176. Therefore, the repair line 176 provided in the pixel that is not repaired is not electrically connected with other electrodes provided in the pixel that is not repaired. As a result, the light emitting elements respectively provided in the two pixels provided with the repair line 176 may be driven independently.

According to the present disclosure, the following advantageous effects may be obtained.

According to the present disclosure, in the manufacturing process of the light emitting display panel in which the planarization layer, the passivation layer and the buffer are etched to form contact holes, the buffer provided below the repair line for connecting the driving transistor of the normal pixel with the light emitting element of the defective pixel is not etched by the contact electrode provided below the repair line. Therefore, the repair line provided in the pixel that is not repaired is not electrically connected with the other electrodes provided in the pixel that is not repaired. Therefore, the light emitting elements respectively provided in the two pixels provided with the repair line may be driven independently.

In particular, when the first electrode of the driving transistor is provided between the contact electrode provided below the repair line in the repair contact hole and the buffer, a separation space is not required between the contact electrode and the first electrode, whereby an aperture ratio of the pixel may be improved.

It will be apparent to those skilled in the art that various modifications and variations can be made in the light emitting display panel and the light emitting display apparatus using the same display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display panel, comprising:
a substrate including a non-display area and a display area provided with pixels;
a driving light-shielding electrode provided on the substrate in a form of a pattern;
a buffer covering the driving light-shielding electrode;
a pixel driving circuit layer provided in the buffer, including a driving transistor connected with the driving light-shielding electrode;
a planarization layer covering the pixel driving circuit layer;
an anode provided in the planarization layer and connected with the driving light-shielding electrode and the driving transistor;
a repair line provided in the planarization layer;
a bank covering an outer portion of the anode to form an opening area from which the anode is exposed;
a light emitting layer provided on the anode and the bank;
a cathode provided on the light emitting layer, and
an island-shaped contact electrode which is provided on the buffer,
wherein the buffer is provided between the driving light-shielding electrode and the contact electrode,
wherein the planarization layer is provided between the repair line and the contact electrode,
wherein the repair line is connected with the contact electrode through a repair contact hole that passes through the planarization layer, and
wherein the contact electrode passes through the buffer to be connected with the driving light-shielding electrode.

2. The light emitting display panel of claim 1, wherein the repair line provided in a first pixel of the pixels is connected with an anode provided in a second pixel adjacent to the first pixel.

3. The light emitting display panel of claim 1, wherein the repair line is connected with the contact electrode through the repair contact hole that passes through a passivation layer, which is provided in the pixel driving circuit layer to cover the driving transistor, and the planarization layer.

4. The light emitting display panel of claim 1, wherein the driving light-shielding electrode is connected with a first electrode of the driving transistor.

5. The light emitting display panel of claim 4, wherein the repair line provided in a first pixel of the pixels is connected with an anode provided in a second pixel adjacent to the first pixel, and
the repair line is separated from a pixel driving circuit provided in the second pixel.

6. The light emitting display panel of claim 4, wherein the repair line is electrically connected with the driving light-shielding electrode through the repair contact hole that passes through the passivation layer, which is provided in the pixel driving circuit layer to cover the driving transistor, the planarization layer and the contact electrode.

7. The light emitting display panel of claim 4, wherein the contact electrode is recessed by passing through the buffer below the repair contact hole to be connected with the driving light-shielding electrode.

8. The light emitting display panel of claim 1, wherein the driving transistor includes:
a semiconductor layer provided on an upper end of the buffer;
a first electrode provided on one side of the semiconductor layer and connected with the anode;
a second electrode provided on the other side of the semiconductor layer;
a gate insulating layer disposed on an upper end of the semiconductor layer; and
a gate provided on an upper end of the gate insulating layer,
wherein the first electrode includes:
an active layer provided on the upper end of the buffer and provided on one side of the semiconductor layer; and
a conductor layer provided on an upper end of the active layer.

9. The light emitting display panel of claim 1, wherein a first electrode within the driving transistor and the driving light-shielding electrode are connected with the anode through an anode line provided in a driving contact hole that passes through the planarization layer, the pixel driving circuit layer and the buffer.

10. The light emitting display panel of claim 9, wherein the first electrode and the contact electrode are spaced apart from each other on an upper end of the buffer.

11. The light emitting display panel of claim 1, wherein the contact electrode is provided on an upper end of a first electrode of the driving transistor, and a contact electrode insulating layer is provided between the contact electrode and the first electrode.

12. The light emitting display panel of claim 11, wherein the first electrode and the driving light-shielding electrode are connected with the anode through an anode line provided in a driving contact hole that passes through the planarization layer, the pixel driving circuit layer and the buffer, and the driving contact hole and the contact electrode are spaced apart from each other.

13. The light emitting display panel of claim 12, wherein the repair line provided in a first pixel of the pixels is connected to an anode provided in a second pixel adjacent to the first pixel, the repair line provided in the first pixel is connected with the first electrode through a repair contact hole provided in a passivation layer, which is provided in the pixel driving circuit layer to cover the driving transistor, and the planarization layer, and the first electrode is connected with the driving light-shielding electrode through the anode line provided in the driving contact hole.

14. The light emitting display panel of claim 11, wherein the first electrode includes:

an active layer provided on one side of a semiconductor layer constituting the driving transistor; and a conductor layer provided on an upper end of the active layer.

15. The light emitting display panel of claim 1, wherein the repair contact hole is provided to overlap the driving light-shielding electrode.

16. A light emitting display apparatus comprising:

a light emitting display panel recited in claim 1;

a data driver for supplying data voltages to data lines provided in the light emitting display panel;

a gate driver for supplying gate voltages to gate lines provided in the light emitting display panel; and a controller for controlling the data driver and the gate driver.

* * * * *